US009621827B2

(12) United States Patent
Mabuchi et al.

(10) Patent No.: US 9,621,827 B2
(45) Date of Patent: Apr. 11, 2017

(54) IMAGING ELEMENT, DRIVING METHOD, AND ELECTRONIC APPARATUS

(71) Applicant: Sony Corporation, Tokyo (JP)

(72) Inventors: Keiji Mabuchi, Kanagawa (JP); Masaki Sakakibara, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 14/401,370

(22) PCT Filed: May 15, 2013

(86) PCT No.: PCT/JP2013/063484
§ 371 (c)(1),
(2) Date: Nov. 14, 2014

(87) PCT Pub. No.: WO2013/176007
PCT Pub. Date: Nov. 28, 2013

(65) Prior Publication Data
US 2015/0124132 A1 May 7, 2015

(30) Foreign Application Priority Data

May 25, 2012 (JP) ................... 2012-119177
Jun. 1, 2012 (JP) ................... 2012-125658

(51) Int. Cl.
H04N 5/378 (2011.01)
H04N 5/353 (2011.01)
(Continued)

(52) U.S. Cl.
CPC ....... H04N 5/353 (2013.01); H01L 27/14603 (2013.01); H01L 27/14609 (2013.01);
(Continued)

(58) Field of Classification Search
CPC ........ H04N 5/353; H04N 5/374; H04N 5/378; H04N 5/2353; H04N 5/2355; H04N 5/3745; H04N 5/23245
See application file for complete search history.

(56) References Cited

U.S. PATENT DOCUMENTS

2004/0017497 A1* 1/2004 Suzuki ................. H04N 3/1575
348/315
2007/0273785 A1* 11/2007 Ogawa ................. H04N 5/2353
348/362
(Continued)

FOREIGN PATENT DOCUMENTS

JP 2004-015532 A 1/2004
JP 2004-128296 A 4/2004
(Continued)

OTHER PUBLICATIONS

International Search Report; International Application No. PCT/JP2013/063484; Filed: May 15, 2013. (Form PCT/ISA/210).
(Continued)

Primary Examiner — Abdelaaziz Tissire
(74) Attorney, Agent, or Firm — Chip Law Group

(57) ABSTRACT

The present technology relates to an imaging element, a driving method, and an electronic apparatus that can decrease a voltage and increase a saturation signal amount. In each pixel configuring a pixel array unit, a photodiode receiving light from a subject and performing photoelectric conversion on the light and a first charge accumulating unit accumulating charges generated by the photodiode are provided. A reset gate unit to initialize the first charge accumulating unit is connected to the first charge accumulating unit through a third transfer gate unit. When the first charge accumulating unit is initialized, a voltage is applied to gate electrodes of the third transfer gate unit and the reset gate unit and a positive voltage is applied to a well region
(Continued)

provided with a pixel to assist voltage application. Thereby, initialization is appropriately performed and a reset level is suppressed low. As a result, a voltage can be decreased and a saturation signal amount can be increased. The present technology can be applied to a solid-state imaging element.

7 Claims, 22 Drawing Sheets

(51) Int. Cl.
*H04N 5/374* (2011.01)
*H01L 27/146* (2006.01)
*H04N 5/355* (2011.01)
*H04N 5/3745* (2011.01)
*H04N 5/376* (2011.01)

(52) U.S. Cl.
CPC ......... *H04N 5/3532* (2013.01); *H04N 5/3559* (2013.01); *H04N 5/35581* (2013.01); *H04N 5/374* (2013.01); *H04N 5/376* (2013.01); *H04N 5/378* (2013.01); *H04N 5/37452* (2013.01)

(56) References Cited

U.S. PATENT DOCUMENTS

| | | | | |
|---|---|---|---|---|
| 2008/0211941 | A1* | 9/2008 | Deever | H04N 5/2258 348/262 |
| 2009/0251582 | A1 | 10/2009 | Oike | |
| 2009/0262215 | A1* | 10/2009 | Sano | H04N 5/2353 348/229.1 |
| 2010/0226375 | A1 | 9/2010 | Davis | |
| 2011/0096216 | A1* | 4/2011 | Kawai | G03B 7/091 348/296 |

FOREIGN PATENT DOCUMENTS

| | | |
|---|---|---|
| JP | 2004-129015 A | 4/2004 |
| JP | 2006-33381 A | 2/2006 |
| JP | 2007-214832 A | 8/2007 |
| JP | 2009-049870 A | 3/2009 |
| JP | 2009-268083 A | 11/2009 |
| JP | 2010-226375 A | 10/2010 |
| JP | 2011-199816 A | 10/2011 |

OTHER PUBLICATIONS

Written Opinion of the International Searching Authority; International Application No. PCT/JP2013/063484; Dated: Jul. 23, 2013. (Form PCT/ISA/220 and PCT/ISA/237).

* cited by examiner

FIG. 6

IMAGING ELEMENT, DRIVING METHOD, AND ELECTRONIC APPARATUS

TECHNICAL FIELD

The present technology relates to an imaging element, a driving method, and an electronic apparatus and particularly, to an imaging element, a driving method, and an electronic apparatus that enable a global shutter to be realized.

BACKGROUND ART

As imaging elements mounted to a digital video camera, complementary metal oxide semiconductor (CMOS) image sensors (hereinafter, simply referred to as the CISs) have been known. Among the CISs, there is a CIS that has a function called a global shutter in which simultaneity of an exposure time of an image to be imaged has been secured.

In addition, with the miniaturization of a semiconductor process, a voltage applied to a gate of an element such as a metal oxide semiconductor field effect transistor (MOSFET) has decreased.

For example, a relatively high voltage is applied to a gate provided in a pixel of the CMOS image sensor and initialization of each element in the pixel or signal transmission from a photoelectric converting unit to a charge/voltage converting unit in the pixel is performed. However, it is difficult to secure the voltage applied to the gate in the pixel, from the reason described above.

Therefore, a solid-state imaging element that applies a negative voltage to a well when signal transmission is performed to increase a potential level of a photoelectric converting unit and a potential level of a gate unit has been suggested (for example, refer to Patent Document 1).

That is, in such a solid-state imaging element, a photodiode PD21 and a floating diffusion FD22 are provided in a P well region W11 formed in a silicon substrate, as illustrated in FIG. 1.

In this example, the photodiode PD21 includes a $P^+$ layer (charge isolation region) and an n layer (charge accumulation region) to accumulate charges. If a voltage is applied to a transfer gate unit GT23, the charges accumulated in the photodiode PD21 are transferred to the floating diffusion FD22 and are read as signal charges.

In addition, if a voltage is applied to a gate of a reset transistor RT24 according to necessity, the charges accumulated in the floating diffusion FD22 are discharged to the outside and a pixel is initialized.

In the solid-state imaging element illustrated in FIG. 1, when the charges are transferred from the photodiode PD21 to the floating diffusion FD22, the voltage is applied to the gate of the transfer gate unit GT23. However, if the voltage is insufficient, the transfer remainder of the charges is generated as shown by a polygonal line PO11 of the left side in the drawing.

The polygonal line PO11 shows a potential of each unit of the solid-state imaging element, that is, a potential at each position of the photodiode PD21, the transfer gate unit GT23, the floating diffusion FD22, and the reset transistor RT24. In FIG. 1, a downward direction is a positive direction of a potential.

In this case, a potential of a portion shown by an arrow A11, that is, a region right below the transfer gate unit GT23 becomes higher than a potential of a portion of the photodiode PD21. For this reason, a part of the charges of the photodiode PD21 may not be transferred to the floating diffusion FD22 and may remain in the photodiode PD21.

Therefore, in the solid-state imaging element, a negative voltage (negative bias) is applied to the P well region W11, so that the potential of the portion of the photodiode PD21 becomes higher than the potential of the region right below the transfer gate unit GT23, as shown by a polygonal line PO12 of the right side in the drawing.

That is, in a portion shown by an arrow A12 of the polygonal line PO12, if the negative voltage is applied to the P well region W11, the potential of the portion of the photodiode PD21 and the potential of the portion right below the transfer gate unit GT23 increase.

However, the potential of the portion of the photodiode PD21 becomes higher than the potential of the portion right below the transfer gate unit GT23 due to a sensitivity difference of these portions for the negative voltage and assistance to reading of the signal charges is performed. Thereby, a large amount of charges are transferred to the floating diffusion FD22.

As such, the negative bias is applied to the well region of the solid-state imaging element. For this reason, even when the sufficient voltage cannot be applied to the transfer gate unit in the pixel by making the voltage low, the assistance to the reading of the signal charges is performed and a dynamic range of a pixel signal can be expanded.

CITATION LIST

Patent Document

Patent Document 1: Japanese Patent Application Laid-Open No. 2004-129015

SUMMARY OF THE INVENTION

Problems to be Solved by the Invention

However, in a pixel having a so-called lateral over flow integration capacitor (LOFIC) structure in which another charge accumulating element such as a capacitor is mounted to the pixel, in the case in which the charge accumulating element is initialized, if a voltage applied to each element is insufficient, unnecessary charges may not be appropriately discharged or charges may not be injected. In this case, it may become difficult to secure a sufficient saturation signal amount. That is, the dynamic range of the pixel signal obtained by imaging may be narrowed.

The present technology has been made in view of the above-described circumstances and can decrease a voltage and increase a saturation signal amount.

Solutions to Problems

An imaging element to be a first aspect of the present technology is an imaging element including a pixel unit that includes multiple pixels arranged in a matrix and a driving unit that drives the pixel unit. The pixel has a converting unit that converts a physical amount into charges in a conversion period, a charge holding unit that accumulates the charges converted by the converting unit in the conversion period and holds the charges transferred from the converting unit after the conversion period ends, and a reading unit that reads the charges held in the charge holding unit in a read period. When the multiple pixels of the pixel unit are divided equally into two groups of first and second groups and one of the first group and the second group of the pixel unit is set to the read period, the driving unit sets the other to the conversion period.

The driving unit may set the pixels belonging to each of the first group and the second group to the conversion period at the same time for every group.

The imaging element to be the first aspect of the present technology may further include a generating unit that generates an image signal on the basis of the read charges.

The generating unit may generate an image signal of an odd-numbered frame on the basis of the charges read from the first group and may generate an image signal of an even-numbered frame on the basis of the charges read from the second group.

The converting unit may convert incidence light corresponding to the physical amount into charges.

A driving method to be the first aspect of the present technology is a driving method of an imaging element including a pixel unit that includes multiple pixels arranged in a matrix and a driving unit that drives the pixel unit. The pixel has a converting unit that converts a physical amount into charges in a conversion period, a charge holding unit that accumulates the charges converted by the converting unit in the conversion period and holds the charges transferred from the converting unit after the conversion period ends, and a reading unit that reads the charges held in the charge holding unit in a read period. The driving method includes a step of, when the multiple pixels of the pixel unit are divided equally into two groups of first and second groups and one of the first group and the second group of the pixel unit is set to the read period, setting the other to the conversion period by the driving unit.

In the first aspect of the present technology, when the multiple pixels of the pixel unit are divided equally into the two groups of the first and second groups and one of the first group and the second group of the pixel unit is set to the read period, the other is set to the conversion period.

An electronic apparatus to be a second aspect of the present technology is an electronic apparatus having an imaging function. An imaging element including a pixel unit including multiple pixels arranged in a matrix and a driving unit to drive the pixel unit is mounted on the electronic apparatus. The pixel has a converting unit that converts a physical amount into charges in a conversion period, a charge holding unit that accumulates the charges converted by the converting unit in the conversion period and holds the charges transferred from the converting unit after the conversion period ends, and a reading unit that reads the charges held in the charge holding unit in a read period. When the multiple pixels of the pixel unit are divided equally into two groups of first and second groups and one of the first group and the second group of the pixel unit is set to the read period, the driving unit sets the other to the conversion period.

In the second aspect of the present technology, the multiple pixels of the pixel unit of the mounted imaging element are divided equally into the two groups of the first and second groups and one of the first group and the second group of the pixel unit is set to the read period, the other is set to the conversion period.

An imaging element according to a third aspect of the present technology includes a photoelectric converting unit that performs photoelectric conversion on incident light, a charge accumulating unit that accumulates charges obtained by the photoelectric conversion, an initializing unit that is connected to the charge accumulating unit through at least one or more gates and initializes the charge accumulating unit, and a voltage application control unit that applies a positive voltage to a well region where the photoelectric converting unit, the charge accumulating unit, and the initializing unit are provided, when the charge accumulating unit is initialized.

The voltage application control unit may apply the positive voltage to the well region at the time of initializing the charge accumulating unit to read a reset level and at the time of reading a signal level.

The charge accumulating unit may be a capacitor.

The capacitor may have any of a MIM structure, a PIM structure, and a PIP structure.

The photoelectric converting unit, the charge accumulating unit, and the initializing unit may be provided for each of a plurality of pixels configuring a pixel array unit to image an image and the voltage application control unit may apply the positive voltage to all pixels on the pixel array unit at the same time.

The well regions of all pixels on the pixel array unit may be formed to be electrically integrated.

The photoelectric converting unit, the charge accumulating unit, and the initializing unit may be provided for each of a plurality of pixels configuring a pixel array unit to image an image and the voltage application control unit may apply the positive voltage for every pixel row including pixels arranged in a horizontal direction on the pixel array unit.

The well regions of the pixels of the pixel row on the pixel array unit may be formed to be electrically integrated and the well region of each pixel row may be electrically isolated.

The photoelectric converting unit, the charge accumulating unit, and the initializing unit may be provided for each of a plurality of pixels configuring a pixel array unit to image an image and the voltage application control unit may apply the positive voltage for every pixel block including some pixels on the pixel array unit.

The well regions of the pixels of the pixel block on the pixel array unit may be formed to be electrically integrated and the well region of each pixel block may be electrically isolated.

The photoelectric converting unit, the charge accumulating unit, and the initializing unit may be provided for each of a plurality of pixels configuring a pixel array unit to image an image and the well region of each pixel on the pixel array unit may be electrically isolated.

The imaging element may further include a charge/voltage converting unit that is provided between the initializing unit and the charge accumulating unit and converts charges into a voltage signal and the charges accumulated in the charge accumulating unit may be transferred to the charge/voltage converting unit through one or more gates.

A driving method according to the third aspect of the present technology is a driving method of an imaging element including a photoelectric converting unit that performs photoelectric conversion on incident light, a charge accumulating unit that accumulates charges obtained by the photoelectric conversion, and an initializing unit that is connected to the charge accumulating unit through at least one or more gates and initializes the charge accumulating unit. The driving method includes a step of applying a positive voltage to a well region where the photoelectric converting unit, the charge accumulating unit, and the initializing unit are provided, when the charge accumulating unit is initialized.

In the third aspect of the present technology, in the imaging element including the photoelectric converting unit that performs the photoelectric conversion on the incident light, the charge accumulating unit that accumulates the charges obtained by the photoelectric conversion, and the initializing unit that is connected to the charge accumulating unit through at least one or more gates and initializes the charge accumulating unit, the positive voltage is applied to the well region where the photoelectric converting unit, the charge accumulating unit, and the initializing unit are provided, when the charge accumulating unit is initialized.

Effects of the Invention

According to the first aspect of the present technology, a global shutter where a handling charge amount is large can be realized without providing a non-exposure period for an entire screen.

According to the second aspect of the present technology, a global shutter where a handling charge amount is large can be realized without providing a non-exposure period for an entire screen.

In addition, according to the second aspect of the present technology, a moving image having a high frame rate or an image in which a state of an instant of a subject moving fast is captured can be imaged and sensitivity increases at the same frame rate.

According to the third aspect of the present technology, a voltage can be decreased and a saturation signal amount can be increased.

BRIEF DESCRIPTION OF DRAWINGS

FIG. 6 is a diagram illustrating a division method of two groups of a pixel array unit corresponding to a color image.

MODE FOR CARRYING OUT THE INVENTION

Hereinafter, best modes (hereinafter, referred to as embodiments) to carry out the present technology will be described in detail with reference to the drawings.

<First Embodiment>
[Configuration Example of Solid-State Imaging Element]

Figure 1:
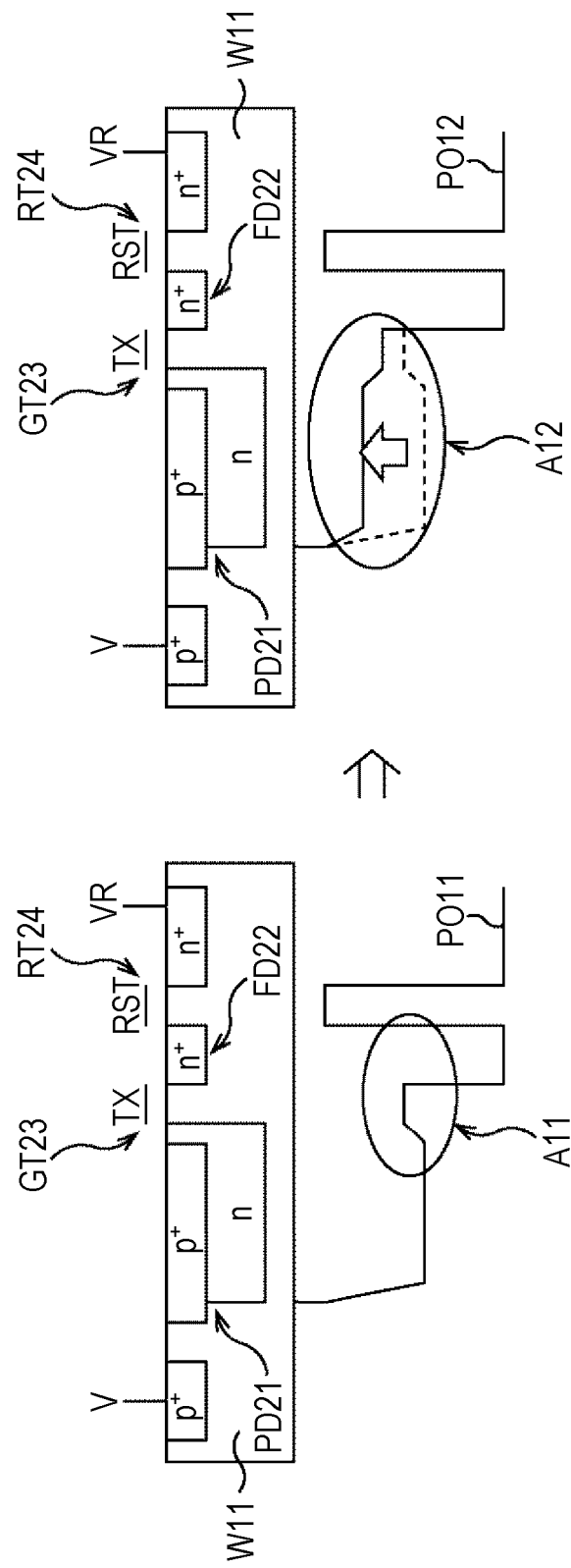
FIG. 1 is a diagram illustrating transfer assistance of charges according to the related art.
Figure 2:
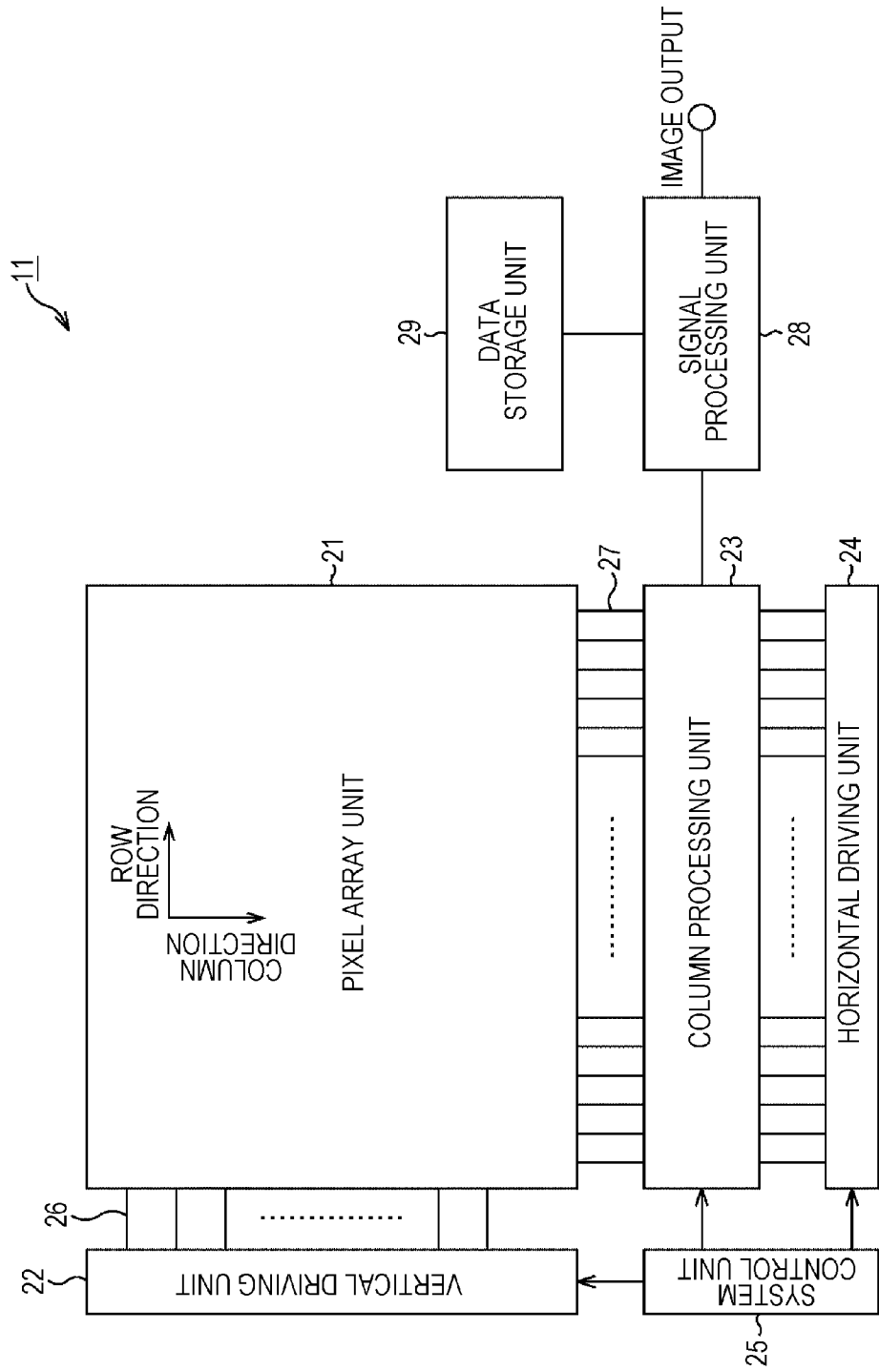
FIG. 2 is a diagram illustrating a configuration example of a solid-state imaging element to which the present technology is applied.

First, a configuration example of a solid-state imaging element to which the present technology is applied will be described. FIG. 2 is a diagram illustrating a configuration example of an embodiment of the solid-state imaging element to which the present technology is applied.

A solid-state imaging element 11 is configured from a CMOS image sensor, for example, and receives light from a subject, executes photoelectric conversion on the light, and generates an image signal, thereby imaging an image.

The solid-state imaging element 11 includes a pixel array unit 21, a vertical driving unit 22, a column processing unit 23, a horizontal driving unit 24, a system control unit 25, pixel driving lines 26, vertical signal lines 27, a signal processing unit 28, and a data storage unit 29.

In the solid-state imaging element 11, the pixel array unit 21 is formed on a semiconductor substrate (chip) not illustrated in the drawings and the vertical driving unit 22 to the system control unit 25 are integrated on the semiconductor substrate.

The pixel array unit 21 includes pixels each having a photoelectric converting unit that generates charges according to an amount of light incident from the subject and accumulates the charges and the pixels configuring the pixel array unit 21 are arranged two-dimensionally in a horizontal direction (row direction) and a longitudinal direction (column direction) in the drawing.

For example, in the pixel array unit 21, the pixel driving lines 26 are provided along the row direction, for every pixel row including pixels arranged in the row direction, and the vertical signal lines 27 are provided along the column direction, for every pixel column including pixels arranged in the column direction.

The vertical driving unit 22 includes a shift register or an address decoder. The vertical driving unit 22 supplies a signal to each pixel through the plurality of pixel driving lines 26 and drives each pixel of the pixel array unit 21 at the same time or in a unit of a row, with respect to all pixels.

The column processing unit 23 reads a signal from each pixel through the vertical signal line 27 for each pixel column of the pixel array unit 21, executes a noise removing process, a correlated double sampling process, and an analog to digital (A/D) conversion process, and generates a pixel signal.

The horizontal driving unit 24 includes a shift register or an address decoder and sequentially selects unit circuits of the column processing unit 23 corresponding to the pixel columns. By selective scanning by the horizontal driving unit 24, pixel signals signal-processed for each unit circuit in the column processing unit 23 are sequentially output to the signal processing unit 28.

The system control unit 25 includes a timing generator to generate various timing signals and performs driving control of the vertical driving unit 22, the column processing unit 23, and the horizontal driving unit 24, on the basis of the timing signals generated by the timing generator.

The signal processing unit 28 executes a signal process such as an operation process on the pixel signals supplied from the column processing unit 23 while temporarily storing data in the data storage unit 29, according to necessity, and outputs an image signal configured from each pixel signal.

In the solid-state imaging element 11, for example, global exposure is performed, that is, an exposure start and an exposure end are performed at the same timing with respect to all pixels of the pixel array unit 21. A global shutter function of realizing the global exposure is preferably used for imaging of a subject moving fast or sensing requiring simultaneity of an imaging image.

[Configuration Example of Pixel]

Figure 3:
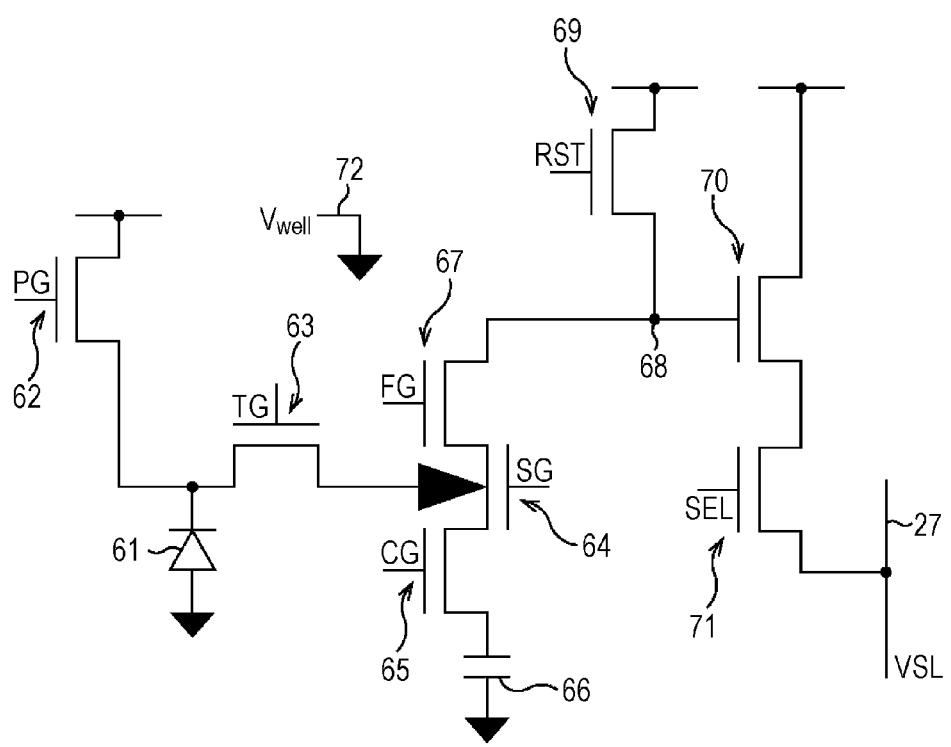
FIG. 3 is a diagram illustrating a configuration example of a pixel.

Next, a configuration of each pixel of the pixel array unit 21 will be described. FIG. 3 is a circuit diagram illustrating a configuration example of one pixel provided in the pixel array unit 21.

In FIG. 3, the pixel of the pixel array unit 21 includes a photodiode 61, a charge discharging gate unit 62, a first transfer gate unit 63, a first charge accumulating unit 64, a second transfer gate unit 65, a second charge accumulating unit 66, a third transfer gate unit 67, a charge/voltage converting unit 68, a reset gate unit 69, an amplification transistor 70, and a selection transistor 71.

The photodiode 61 is a photodiode of a PN junction and receives light from the subject, generates charges according to an amount of received light, and accumulates the charges.

The charge discharging gate unit 62 is connected between the photodiode 61 and a power supply not illustrated in the drawings and discharges the charges accumulated in the photodiode 61 to the outside, according to a driving signal PG applied to a gate electrode of the charge discharging gate unit 62.

For example, in FIG. 3, the charge discharging gate unit 62, the first transfer gate unit 63, the second transfer gate unit 65, the third transfer gate unit 67, the reset gate unit 69, and the selection transistor 71 are configured from a MOS transistor of an N channel.

In addition, driving signals PG, TG, CG, FG, RST, and SEL are supplied to gate electrodes of the charge discharging gate unit 62 to the selection transistor 71. The driving signals are pulse signals in which a state of a high level (for example, a power supply voltage VDD) becomes an active state (on state) and a state of a low level (for example, a negative potential) becomes an inactive state (off state).

Therefore, for example, in the charge discharging gate unit 62, when the driving signal PG supplied to the gate electrode of the charge discharging gate unit 62 enters an active state and the charge discharging gate unit 62 is turned on, a state becomes a conductive state and the charges accumulated in the photodiode 61 are discharged. The charge discharging gate unit 62 is provided to prevent occurrence of the phenomenon of the photodiode 61 being saturated with the charges in a period where the charges are not accumulated and the charges more than a saturation charge amount overflowing to the first charge accumulating unit 64, the second charge accumulating unit 66, and peripheral pixels.

The first transfer gate unit 63 is provided between the photodiode 61 and the first charge accumulating unit 64. If the driving signal TG supplied to the gate electrode of the first transfer gate unit 63 enters an active state, the first transfer gate unit 63 transfers the charges accumulated in the photodiode 61 to the first charge accumulating unit 64.

The first charge accumulating unit 64 is provided as an embedded MOS capacitor and accumulates the charges transferred from the photodiode 61 through the first transfer gate unit 63. The driving signal SG is applied to the gate electrode of the first charge accumulating unit 64. If the driving signal SG enters an active state, that is, a high-level state, a potential of a portion of the first charge accumulating unit 64 decreases and a large amount of charges can be accumulated.

The second transfer gate unit 65 is provided between the first charge accumulating unit 64 and the second charge accumulating unit 66.

If the driving signal CG supplied to the gate electrode of the second transfer gate unit 65 enters an active state (high level), the second transfer gate unit 65 enters a conductive state. For this reason, the potentials of the first charge accumulating unit 64 and the second charge accumulating unit 66 are coupled to each other.

In addition, if the driving signal CG supplied to the gate electrode of the second transfer gate unit 65 enters an inactive state (low level), the second transfer gate unit 65 enters a non-conductive state. For this reason, the potentials of the first charge accumulating unit 64 and the second charge accumulating unit 66 are divided.

The second charge accumulating unit 66 is configured by a capacitor having a capacity value per unit area larger than that of the first charge accumulating unit 64 and the second charge accumulating unit 66 is a LOFIC. The third transfer gate unit 67 is connected to the charge/voltage converting unit 68 to which the gate electrode of the amplification transistor 70 is connected and the driving signal FG functioning as a transfer signal is applied to the gate electrode of the third transfer gate unit 67.

If the driving signal FG enters an active state, that is, the driving signal FG is at a high level, the third transfer gate unit 67 enters a conductive state and transfers the charges accumulated in the first charge accumulating unit 64 to the charge/voltage converting unit 68. The charge/voltage converting unit 68 is a floating diffusion region that converts the charges transferred from the first charge accumulating unit 64 into an electric signal, for example, a voltage signal and outputs the voltage signal.

The reset gate unit 69 is an element that appropriately initializes (resets) each region from the charge/voltage converting unit 68 to the second charge accumulating unit 66 and a drain of the reset gate unit is connected to a power supply of a reset voltage VR and a source thereof is connected to the charge/voltage converting unit 68. The driving signal RST is applied as a reset signal to the gate electrode of the reset gate unit 69.

In addition, if the driving signal RST enters an active state, the reset gate unit 69 enters a conductive state and the potential of the charge/voltage converting unit 68 is reset to a level of the reset voltage VR. That is, initialization of the charge/voltage converting unit 68 is performed.

A gate electrode of the amplification transistor 70 is connected to the charge/voltage converting unit 68 and a drain thereof is connected to a power supply of a power supply voltage. The amplification transistor 70 becomes a read circuit reading the charges obtained by photoelectric conversion in the photodiode 61, that is, an input unit of a so-called source follower circuit. That is, a source of the amplification transistor 70 is connected to the vertical signal line 27 through the selection transistor 71, so that the amplification transistor 70 configures a source follower circuit with a constant current source connected to one end of the vertical signal line 27.

The selection transistor 71 is connected between the source of the amplification transistor 70 and the vertical signal line 27 and the driving signal SEL functioning as a selection signal is supplied to the gate electrode of the selection transistor 71. If the driving signal SEL enters an active state, the selection transistor 71 enters a conductive state and a pixel provided with the selection transistor 71 is selected. If the pixel is selected, a signal output from the amplification transistor 70 is read to the column processing unit 23 through the vertical signal line 27.

In each pixel, a plurality of driving lines are provided as the pixel driving lines 26 of FIG. 2, for every pixel row. In addition, the driving signals PG, TG, SG, CG, FG, RST, and SEL are supplied from the vertical driving unit 22 of FIG. 2 to the pixels through the plurality of driving lines functioning as the pixel driving lines 26.

A connection line 72 that is connected to a power supply not illustrated in the drawing and applies a voltage $V_{well}$ to a well configuring the pixel is connected to the pixel of FIG. 3 through a contact not illustrated in the drawing. Specifically, the vertical driving unit 22 controls application of the voltage $V_{well}$ for the well of each pixel through the connection line 72.

In addition, the control of the voltage application for the well of the pixel is not limited to the vertical driving unit 22 and may be performed by another block of the solid-state imaging element 11 illustrated in FIG. 2 and a block performing only the control of the voltage application may be provided in the solid-state imaging element 11.

However, the solid-state imaging element 11 cannot read the charges of all pixels at the same time and reads the charges in a unit of one row. For this reason, it is necessary to hold a signal in a shielded charge accumulation region in the pixel during waiting for read, to realize the global shutter. Technology for accumulating a part of signals in the charge accumulation region during exposure as well as during waiting for read to increase a handling charge amount, in the solid-state imaging element 11 having the global shutter function, is known (for example, refer to Japanese Patent Application Laid-Open No. 2011-199816 or Japanese Patent Application Laid-Open No. 2009-268083).

Figure 4:
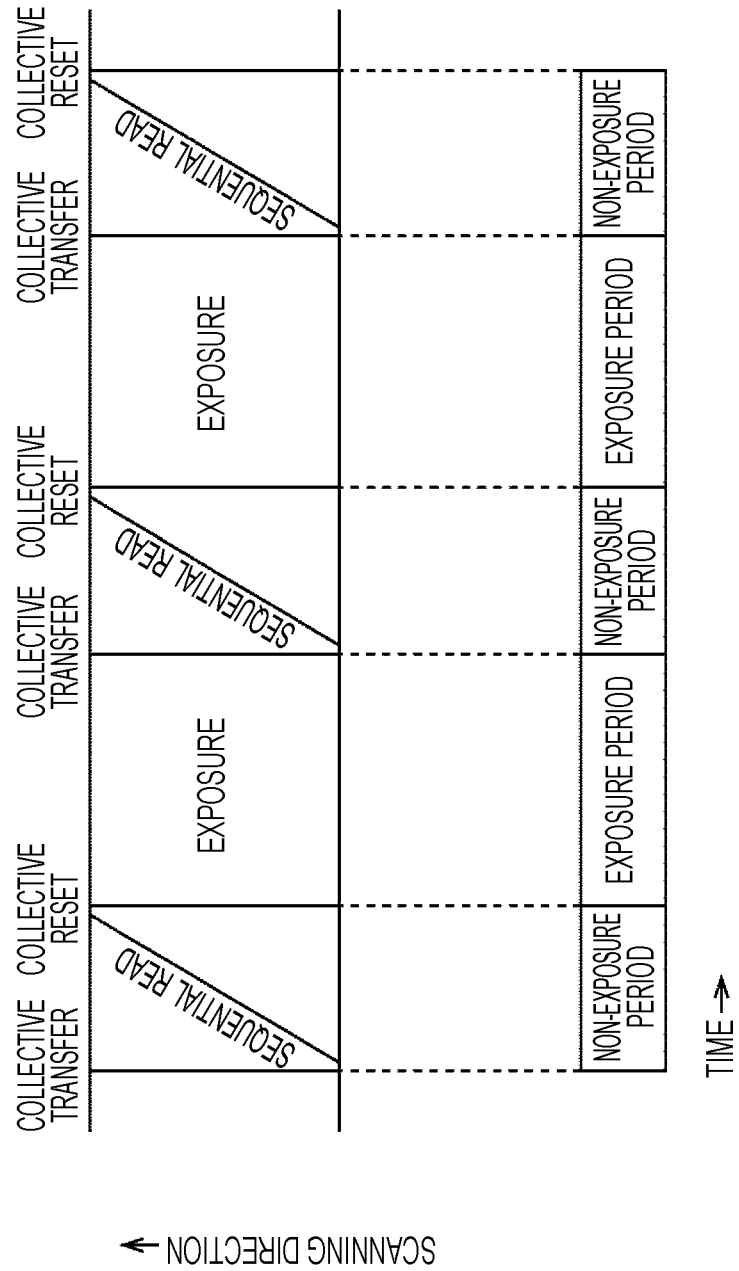
FIG. 4 is a diagram illustrating driving timing when the solid-state imaging element according to the related art executes a global shutter.

Specific description is given below with reference to FIG. 4. FIG. 4 illustrates driving timing when a global shutter where a handling charge amount is increased is executed in the related art.

In the solid-state imaging element 11, after all pixels are collectively reset, the exposure is performed. In an exposure period, photoelectric conversion by a photodiode (PD) is performed in each pixel and the charges obtained by the PD are accumulated in the PD and the charge accumulating unit. If an exposure time ends, the charges remaining in PDs of all pixels are collectively transferred to the charge accumulating unit and the charges of the charge accumulating unit are sequentially read in a unit of one row. Therefore, in the charge accumulating unit of each pixel, there is a waiting time in which a waiting state is maintained while the charges are held, until the accumulated charges are read.

As described above, when the global shutter is executed by the CIS according to the related art, there is a waiting time. Because new charges cannot be accumulated from the PD in a waiting period, the waiting period becomes a non-exposure period.

As such, when there is the non-exposure period, it may be impossible to image a smooth moving image in which continuous exposure is necessary and a frame rate is high or it may be impossible to capture a state of an instant of the subject moving fast. In addition, sensitivity of the moving image when the frame rate is the same may be decreased.

The present technology has been made in view of the above-described circumstances and a resolving method will be described hereinafter.

[With Respect to Arrangement of Pixels in Pixel Array Unit 21]

Multiple pixels configuring the pixel array unit 21 are divided into two groups of a first group and a second group and driving timings of the first group and the second group are independently controlled. In addition, odd-numbered frames are generated by image signals from the pixels of the first group and even-numbered frames are generated by image signals from the pixels of the second group. The odd-numbered frames and the even-numbered frames are different in sampling points (positions of pixels). However, odd-numbered frames and even-numbered frames of which sampling points are viewed equally by interpolation or reduction of an image size may be generated.

Figure 5:
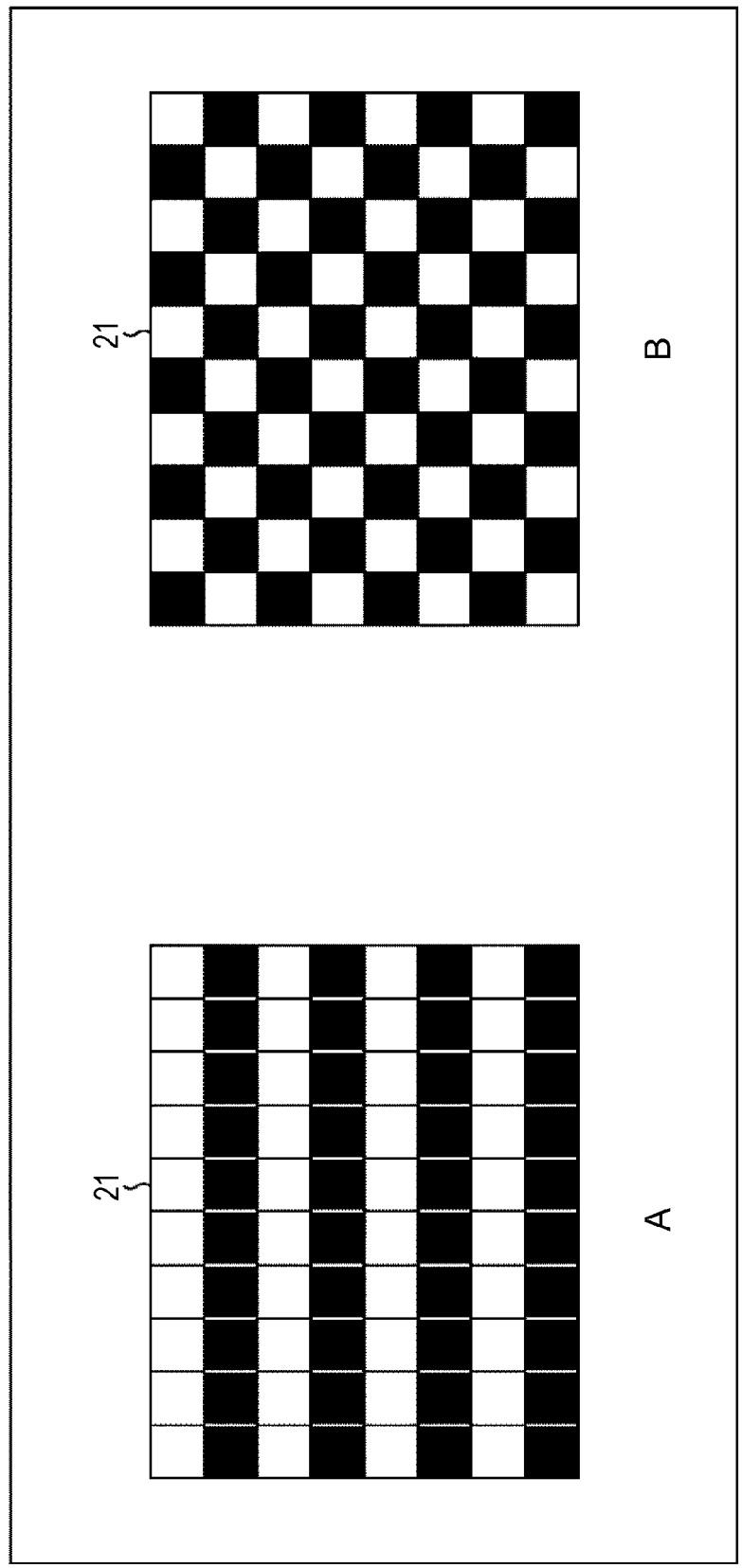
FIG. 5 is a diagram illustrating a division method of two groups of a pixel array unit corresponding to a monochrome image.

FIG. 5 illustrates two examples of a division method of the pixel array unit 21 when the solid-state imaging element 11 outputs a monochrome image.

A of FIG. 5 illustrates a method of dividing the first group and the second group in a horizontal stripe shape alternately for every predetermined rows (for every row in A of FIG. 5), with respect to multiple pixels configuring the pixel array unit 21. B of FIG. 5 illustrates a method of dividing the first group and the second group in a checker board pattern by setting the pixels of all directions of the pixels of the first group as the second group.

Figure 6:
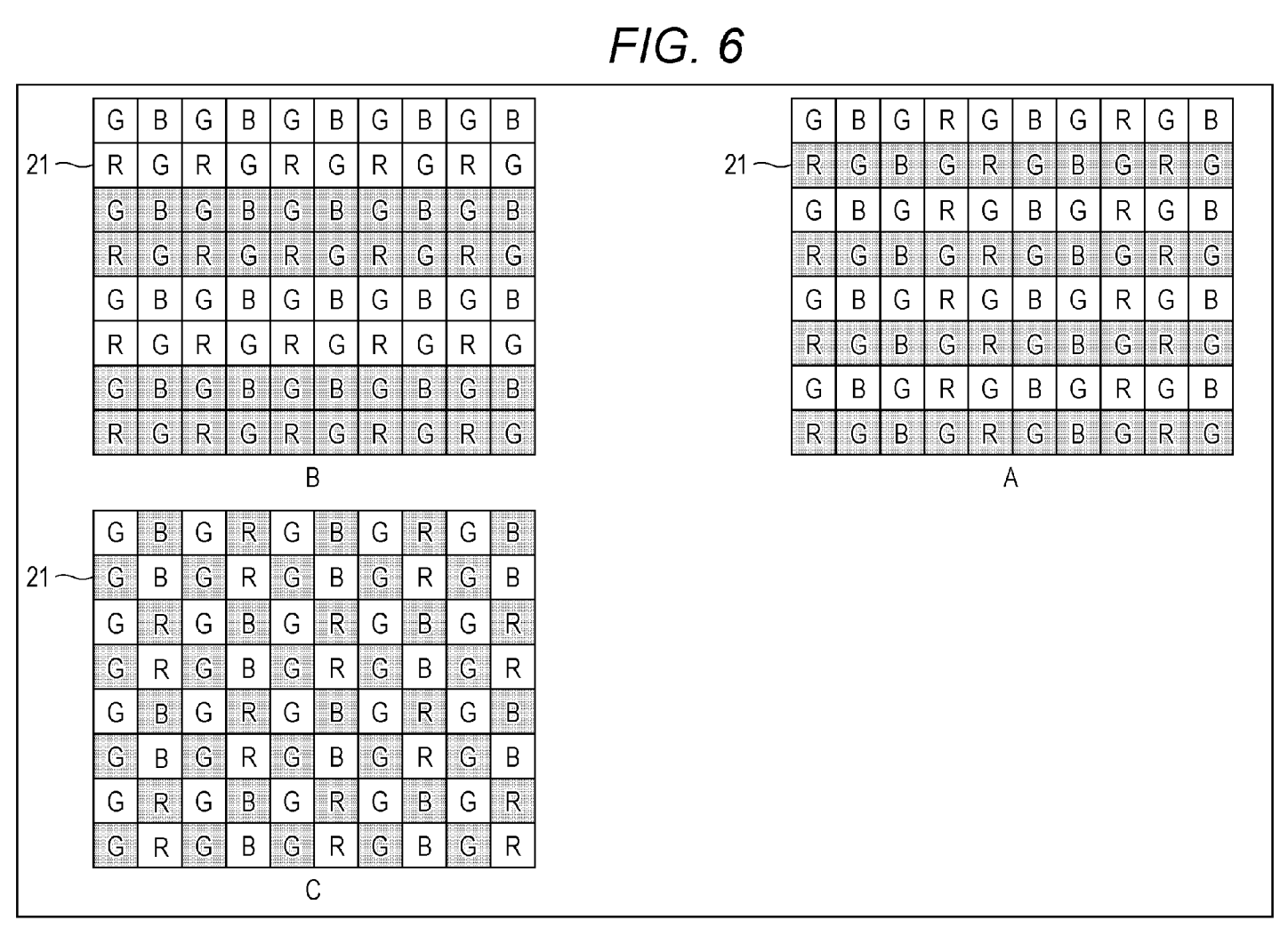

FIG. 6 illustrates three examples of a division method of the pixel array unit 21 when the solid-state imaging element 11 outputs a color image.

A of FIG. 6 illustrates a method of dividing the first group and the second group in a horizontal stripe shape alternately for every row, with respect to multiple pixels configuring the pixel array unit 21. B of FIG. 6 illustrates a method of dividing the first group and the second group in a horizontal stripe shape alternately for every two rows, with respect to multiple pixels configuring the pixel array unit 21. C of FIG. 6 illustrates a method of dividing the first group and the second group in a checker board pattern by setting the pixels of all directions of the pixels of the first group as the second group.

An arrangement of R, G, and B in the solid-state imaging element 11 is not limited to the arrangement example of FIG. 6. In addition, the division method of the first group and the second group is not limited to the example of FIG. 6 and the first group and the second group may be divided equally. In addition, the pixels may be divided into three groups or more, not the two groups.

[With Respect to Operation of Pixel Array Unit 21]

Figure 7:
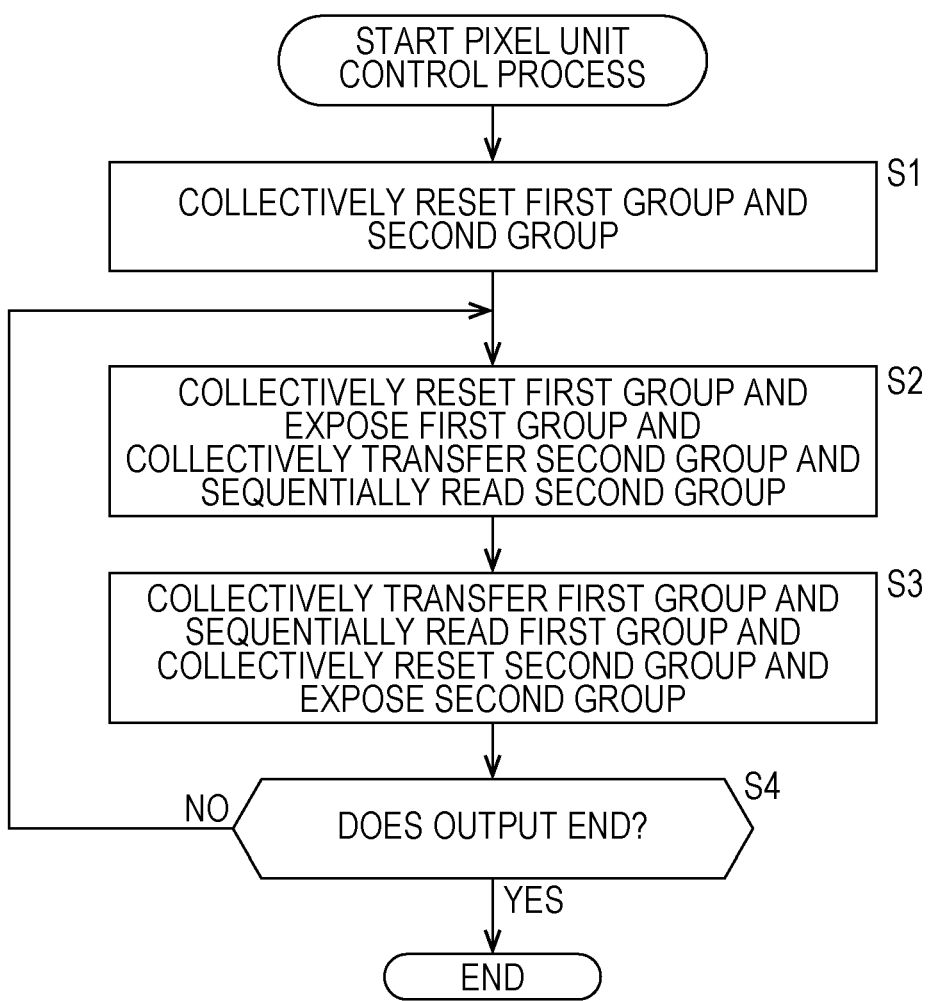
FIG. 7 is a flowchart illustrating a pixel unit control process.

Next, an operation of the pixel array unit 21 will be described. FIG. 7 is a flowchart illustrating an operation of the pixel array unit 21.

A pixel unit control process starts when the solid-state imaging element 11 starts to output an image signal for a rear step.

In step S1, all pixels (that is, the first group and the second group) configuring the pixel array unit 21 are collectively reset.

In step S2, after the collective resetting, (the photodiodes 61 of) the pixels belonging to the first group enter an exposure period. Thereby, accumulation of the charges subjected to the photoelectric conversion starts. The read charges are output as electric signals to the column processing unit 23 and become image signals of the odd-numbered frames. In parallel with this, in the pixels belonging to the second group, the charges remaining in the photodiode 61 are collectively transferred to a rear step and read of the charges is performed sequentially for every row. In the process of first step S1, because the second group does not yet enter the exposure period, a process for the second group may be omitted.

In step S3, in the pixels belonging to the first group, the charges remaining in the photodiode 61 are collectively transferred to a rear step and read of the charges is performed sequentially for every row. The read charges are output as electric signals to the column processing unit 23 and become image signals of even-numbered frames. In parallel with this, after the collective resetting, (the photodiodes 61 of) the pixels belonging to the second group enter the exposure period. Thereby, accumulation of the charges subjected to the photoelectric conversion starts.

In step S4, it is determined whether an output of an image signal from the solid-state imaging element 11 ends, the process returns to step S2 until it is determined that the output of the image signal ends, and steps S2 and S3 are repeated. With the above, the description of the pixel unit control process ends.

Figure 8:
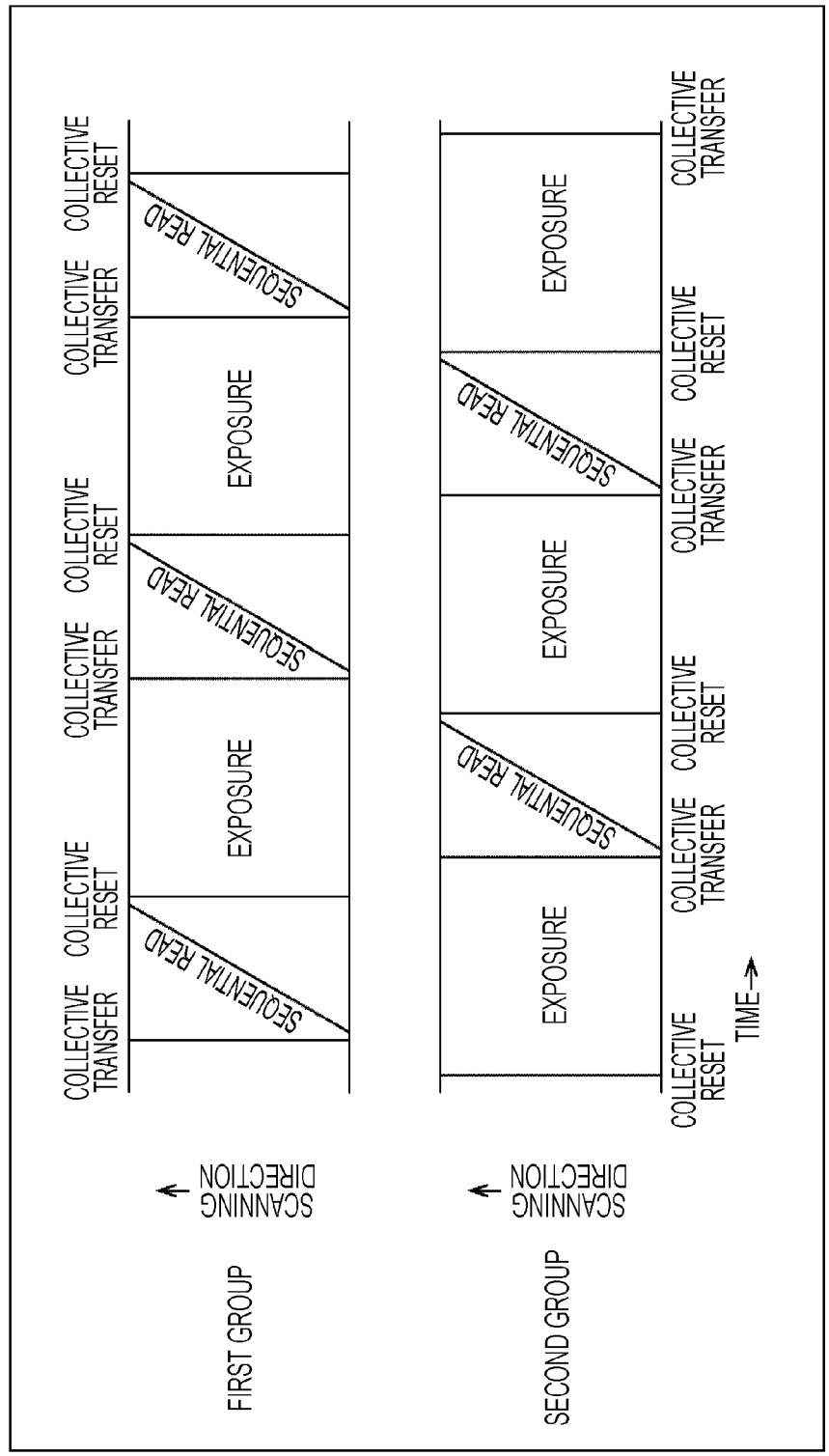
FIG. 8 is a diagram illustrating driving timings of a first group and a second group of the pixel array unit.
Figure 9:
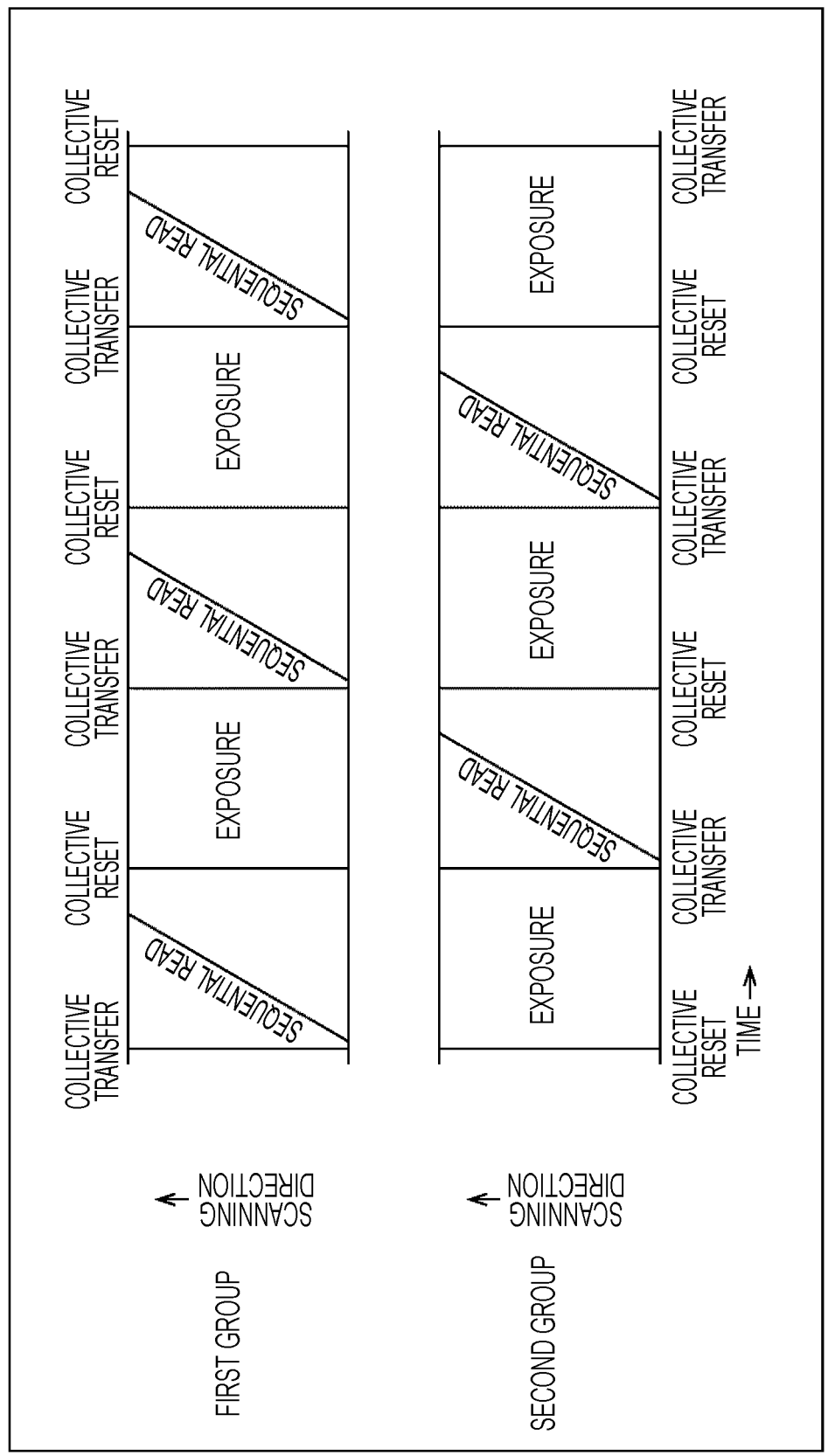
FIG. 9 is a diagram illustrating driving timings of the first group and the second group of the pixel array unit.

FIGS. 8 and 9 illustrate driving timings of the first group and the second group of the pixel array unit 21 by the pixel unit control process described above. FIG. 8 illustrates an example of the case in which a part of the exposure period overlaps in the first group and the second group and FIG. 9 illustrates an example of the case in which the exposure period does not overlap in the first group and the second group.

As apparent from FIGS. 8 and 9, when one of the first group and the second group of the pixel array unit 21 enters the exposure period, the other enters a sequential read period (non-exposure period). For this reason, the global shutter can be realized without setting the non-exposure period for the entire pixel array unit 21. In addition, the exposure period can be continuously maintained for the entire pixel array unit 21. Therefore, the solid-state imaging element 11 can be adopted for an imaging use to image a smooth moving image in which continuous exposure is necessary and a frame rate is high or to capture a state of an instant of the subject moving fast. In addition, the sensitivity decrease by existence of the non-exposure period can be prevented.

Because the two read operations are necessary for reading one pixel signal, the frame rate becomes ½ when the operation according to the related art illustrated in FIG. 4 is executed. In addition, the frame rate decreases as much as the exposure period increases. In the solid-state imaging element 11 according to this embodiment executing the driving illustrated in FIG. 8 or 9, because the number of pixels read for one frame becomes ½, the frame rate does not become ½, even though read is performed two times. In addition, because read of the other pixel group is performed in the exposure period of one pixel group, the frame rate is not decreased by the exposure time.

In the case of FIG. 9, a user senses that only the handling charge amount increases, without the existence of the non-exposure period or the decrease in the frame rate, with respect to the solid-state imaging element having the global shutter function not using the technology for accumulating the part of the signal in the charge accumulation region even during the exposure to increase the handling charge amount.

In the case of FIG. 8, there is a difference in that a period where the exposure overlaps exists and the sensitivity can be increased.

In both cases of FIGS. 8 and 9, the timing of the collective resetting can be adjusted or the collective resetting can be performed several times between the exposure time and a next exposure time. That is, a substantial exposure time can be adjusted without changing the frame rate.

<Second Embodiment>

[With Respect to Structure of each Pixel]

Figure 10:
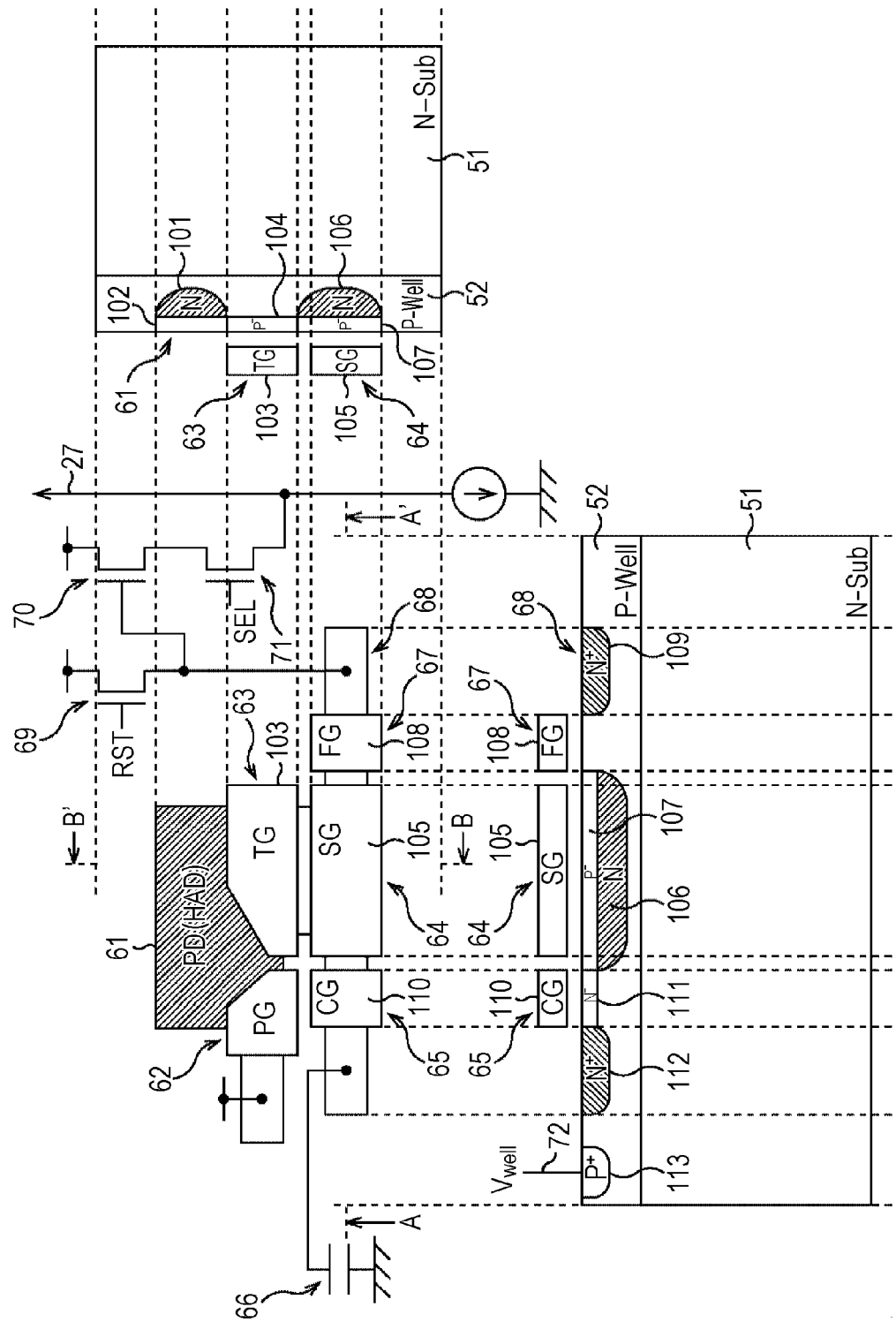
FIG. 10 is a diagram illustrating a layout and a cross-section of a pixel.

A structure of the pixel illustrated in FIG. 3 will be described. FIG. 10 is a diagram illustrating the structure of the pixel illustrated in FIG. 3. In FIG. 10, a plane pattern illustrating a pixel layout and cross-sections taken along A-A' and B-B' in the plane pattern, respectively, are illustrated. In FIG. 10, portions corresponding to those in the case of FIG. 3 are denoted with the same reference numerals and explanation thereof is appropriately omitted.

As illustrated in the cross-section taken along B-B', a photodiode 61 has a configuration of a diode of a PN junction obtained by forming an N-type semiconductor region 101 in a P-type well 52 on a semiconductor substrate 51. The photodiode 61 becomes an embedded photodiode in which a P-type semiconductor region 102 is formed in a surface layer portion thereof and a depletion end is separated from an interface.

A first transfer gate unit 63 has a configuration in which a gate electrode 103 is arranged on a surface of a substrate with a gate insulating film (not illustrated in the drawings) therebetween and a P$^-$-type semiconductor region 104 is formed on a surface layer portion of the substrate. As compared with the case in which the P$^-$-type semiconductor region 104 is not formed, the P$^-$-type semiconductor region 104 slightly deepens a potential right below the gate electrode 103.

Thereby, the P$^-$-type semiconductor region 104 becomes an overflow path to transfer the charges of the predetermined amount or more overflown from the photodiode 61 to the first charge accumulating unit 64. Here, the charges of the predetermined amount or more are specifically charges more than a saturation charge amount of the photodiode 61.

The first charge accumulating unit 64 has a gate electrode 105 arranged on the surface of the substrate with a gate insulating film (not illustrated in the drawings) therebetween and is formed as an embedded MOS capacitor under the gate electrode 105. That is, the first charge accumulating unit 64 is configured by an embedded MOS capacitor including the gate electrode 105, an N-type semiconductor region 106 formed in a P-type well 52 right below the gate electrode 105, and a P$^-$-type semiconductor region 107 formed on a surface layer portion thereof.

A third transfer gate unit 67 has a gate electrode 108 that is arranged on the surface of the substrate with a gate insulating film (not illustrated in the drawings) therebetween. In the third transfer gate unit 67, the N-type semiconductor region 106 of the first charge accumulating unit 64 is used as one source/drain region and an N$^+$-type semiconductor region 109 becoming a charge/voltage converting unit 68 is used as the other source/drain region.

In this example, the first charge accumulating unit 64 has a pixel structure formed as an embedded MOS capacitor under the gate electrode 105 of the first charge accumulating unit 64 formed to be adjacent to the first transfer gate unit 63 and the third transfer gate unit 67.

A second transfer gate unit 65 has a gate electrode 110 arranged on the surface of the substrate with a gate insulating film (not illustrated in the drawings) therebetween and uses the N-type semiconductor region 106 of the first charge accumulating unit 64 as one source/drain region. One end of a second charge accumulating unit 66 is connected to the other source/drain region of the second transfer gate unit 65.

In addition, the second transfer gate unit 65 has a structure in which an N⁻-type semiconductor region 111 is formed in a P-type well 52 right below the gate electrode 110. As compared with the case in which the N⁻-type semiconductor region 111 is not formed, the N⁻-type semiconductor region 111 slightly deepens a potential right below the gate electrode 110. Thereby, the N⁻-type semiconductor region 111 becomes an overflow path to transfer the charges of the predetermined amount or more overflown from the first charge accumulating unit 64 to the second charge accumulating unit 66 through an N⁺-type semiconductor region 112.

In the pixel of FIG. 10, a P⁺-type semiconductor region 113 is formed in the P-type well 52, that is, the surface layer portion of the substrate and a connection line 72 is connected to the P⁺-type semiconductor region 113.

In the pixel, the gate electrode 105 of the first charge accumulating unit 64, the second transfer gate unit 65, and the third transfer gate unit 67 couple or divide the potentials of the charge/voltage converting unit 68, the first charge accumulating unit 64, and the second charge accumulating unit 66.

[With Respect to Arrangement of Pixels in Pixel Array Unit]

As described above, a voltage $V_{well}$ is applied to each pixel provided in the pixel array unit 21 through the connection line 72 or a contact. However, the contact connecting the connection line 72 and the pixel (P-type well 52) may be provided in a unit of a row or may be provided for every pixel.

Figure 11:
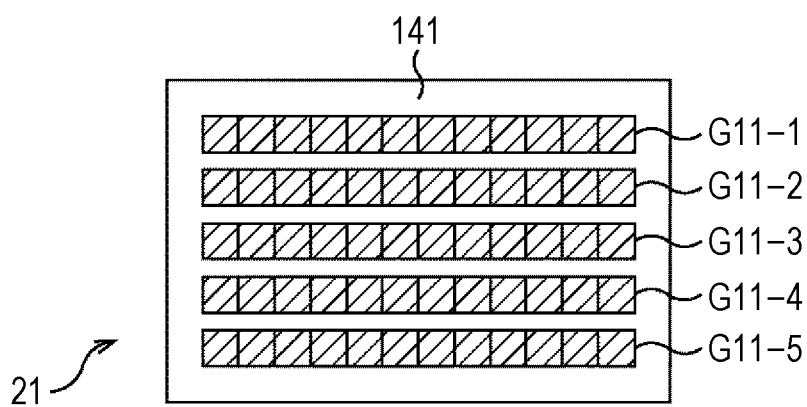
FIG. 11 is a diagram illustrating a configuration example of each pixel and a P-type well.

For example, when each pixel is connected to a power supply in a unit of a row, as illustrated in FIG. 11, individual pixel rows G11-1 to G11-5 are provided in an N⁻-type semiconductor region 141 provided on the substrate of the pixel array unit 21. That is, each of the pixel rows G11-1 to G11-5 is divided by the N⁻-type semiconductor region 141 and is electrically isolated.

Hereinafter, when it is not necessary to distinguish the pixel rows G11-1 to G11-5 in particular, the pixel rows G11-1 to G11-5 are also simply called the pixel rows G11.

In the pixel row G11, a plurality of pixels arranged in a horizontal direction (row direction) in the drawings are provided in one P-type well 52 divided by the N⁻-type semiconductor region 141. That is, a region of the P-type well 5 is electrically isolated for every pixel row. In other words, the P-type well 52 of each pixel of the pixel row is integrally formed and the P-type well 52 of each pixel row is electrically isolated.

In FIG. 11, one square in the pixel row G11 shows one pixel. In this case, the connection line 72 is connected to one of the pixels configuring the pixel row G11 through the contact. That is, the voltage $V_{well}$ is applied to the P-type well 52 of the pixel row G11 through one connection line 72.

Figure 12:
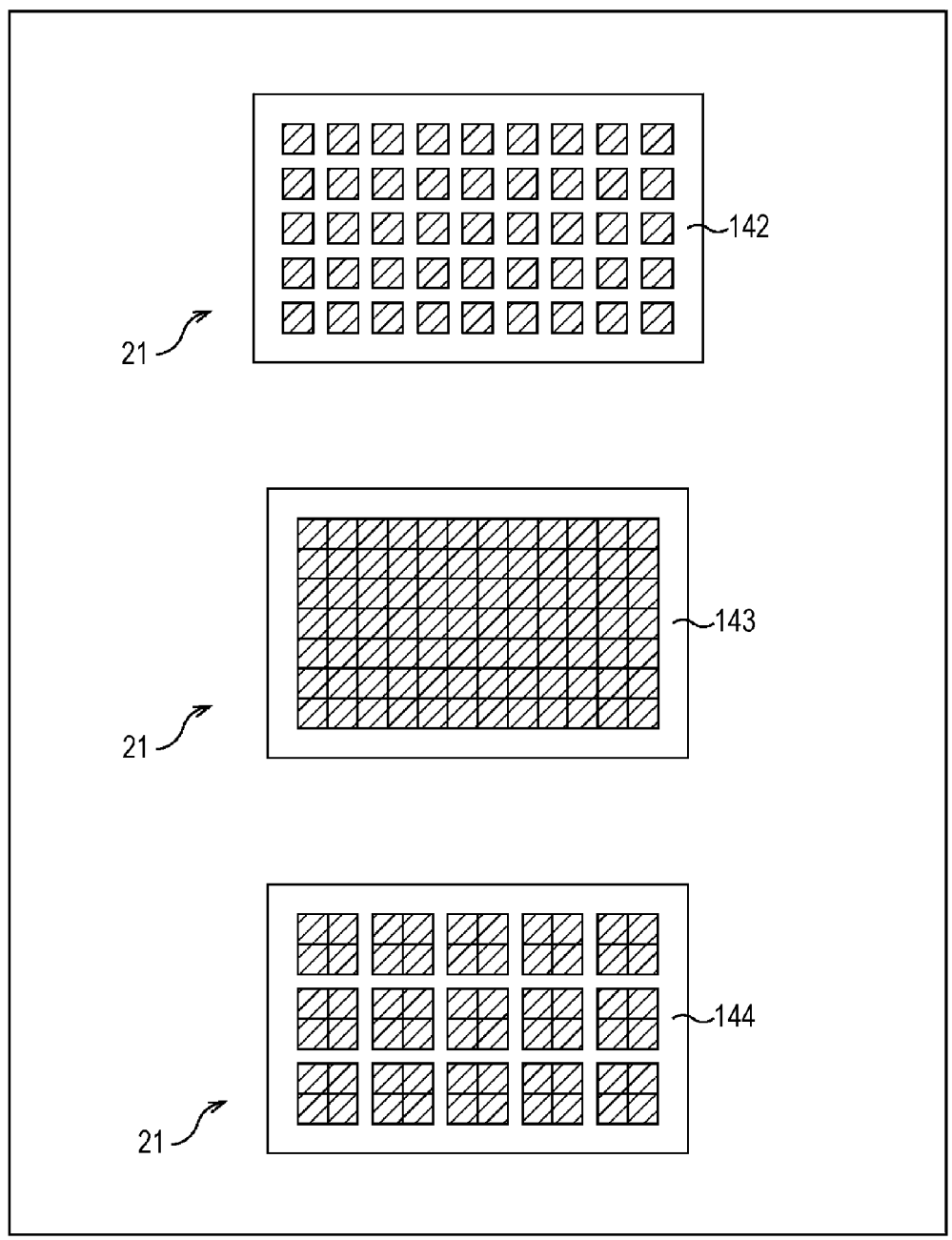
FIG. 12 is a diagram illustrating another configuration example of each pixel and the P-type well.

In addition, when the voltage $V_{well}$ is applied by the connection line 72 for every pixel, for example, as illustrated at the upper side of FIG. 12, each pixel is electrically isolated and is provided in an N⁻-type semiconductor region 142 and the connection line 72 is connected to the P-type well 52 of each pixel through the contact. That is, a region of the P-type well 52 is electrically isolated for every pixel.

Therefore, in this example, the voltage $V_{well}$ is applied to the P-type well 52 for every pixel. In the pixel array unit 21 illustrated at the upper side of FIG. 12, one hatched square shows one pixel.

As such, if the contact is provided for every pixel and a voltage is applied to the P-type well 52, the pixel array unit 21 can be driven at a high speed. Even though the contact is not provided for every pixel, one contact may be provided for some pixels as illustrated in FIG. 11, using electric conduction of the P-type well 52.

In addition, when one contact is provided for some pixels, for example, as illustrated at a center of FIG. 12, one P-type well 52 may be provided for the N⁻-type semiconductor region 143 provided on the substrate of the pixel array unit 21 and all pixels may be formed in the P-type well 52. That is, the region of the P-type well 52 is formed to be electrically integrated in all pixels. At the center of FIG. 12, a hatched region shows a region of the pixels and one square in the region shows one pixel.

For example, as illustrated at a lower side of FIG. 12, a plurality of block regions each including some pixels may be electrically isolated and may be provided in the N⁻-type semiconductor region 144 provided on the substrate of the pixel array unit 21. That is, the region of the P-type well 52 may be electrically isolated in a unit of a block including any M×N pixels.

In this case, the connection line 72 is connected to the P-type well 52 of each block region through the contact and the voltage $V_{well}$ is applied to the P-type well 52 for every block region. In the pixel array unit 21 illustrated at the lower side of FIG. 12, a hatched rectangular region shows one block region and one square in each block region shows one pixel.

Generally, the P-type wells 52 provided adjacent to each other need to be isolated from each other by a constant distance. For this reason, if the regions of the pixels are divided in a unit of a block and the contact is provided for every block unit, area efficiency can be improved.

[With Respect to Outline of Present Technology]

Next, an outline of the present technology will be described.

In a pixel of a LOFIC structure in which a charge accumulating element such as a capacitor is mounted, like the pixel configuring the pixel array unit 21, a negative bias is applied to a well region provided with the pixel, when initialization of the charge accumulating element is executed.

Figure 13:
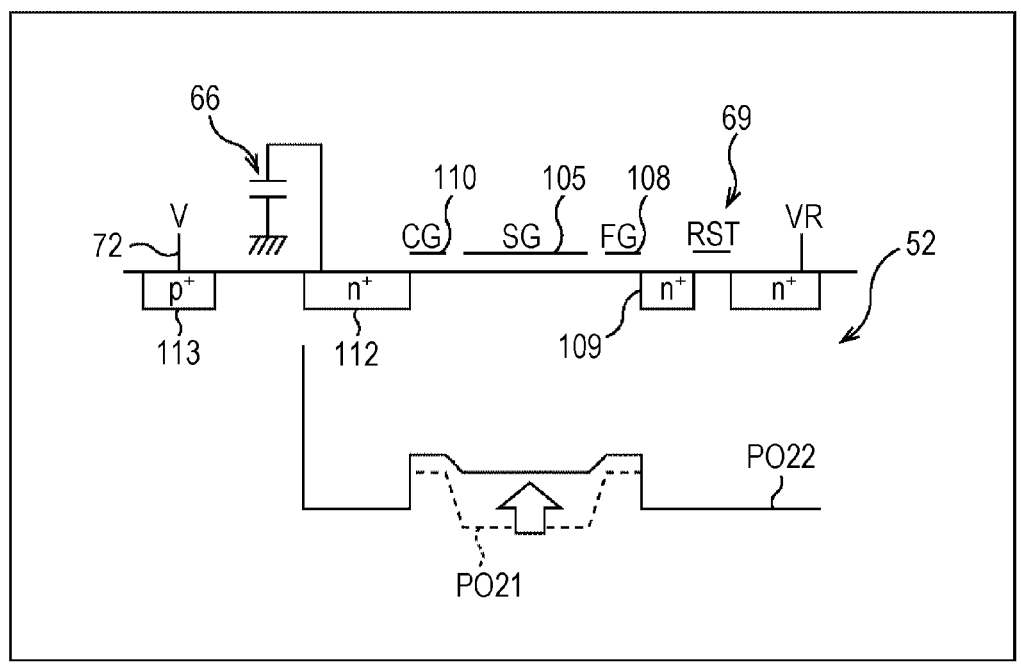
FIG. 13 is a diagram illustrating reset of a first charge accumulating unit.

In this case, for example, as illustrated in FIG. 13, because the potential of the gate unit increases, assistance to the initialization is not made. In FIG. 13, portions corresponding to those in the case of FIG. 10 are denoted with the same reference numerals and explanation thereof is appropriately omitted.

In FIG. 13, polygonal lines PO21 and PO22 show a potential in each region from the N⁺-type semiconductor region 112 to a region right below the reset gate unit 69.

For example, if the negative bias (negative voltage) is applied to the P-type well 52 using the technology described in Patent Document 1, in a state of the potential illustrated by the polygonal line PO21, the state of the potential of each region changes to the state illustrated by the polygonal line PO22.

In this example, because the voltage applied to the gate electrode 110 of the second transfer gate unit 65 and the gate electrode 108 of the third transfer gate unit 67 is insufficient, the potential of the region right below the gate electrode 110 or the gate electrode 108 increases.

For this reason, the potentials of the second charge accumulating unit 66, the first charge accumulating unit 64, and the charge/voltage converting unit 68 are not coupled to each other and the charges may not be injected from the side of the first charge accumulating unit 64 to the second charge accumulating unit 66. That is, the second charge accumulating unit 66 cannot be reset.

In order to correspond to this, the potential may be increased to a state in which the second charge accumulating unit 66 can be initialized, by decreasing a reset voltage VR applied to the drain of the reset gate unit 69. However, in this case, it may become difficult to secure a saturation signal amount of the pixel.

Figure 14:
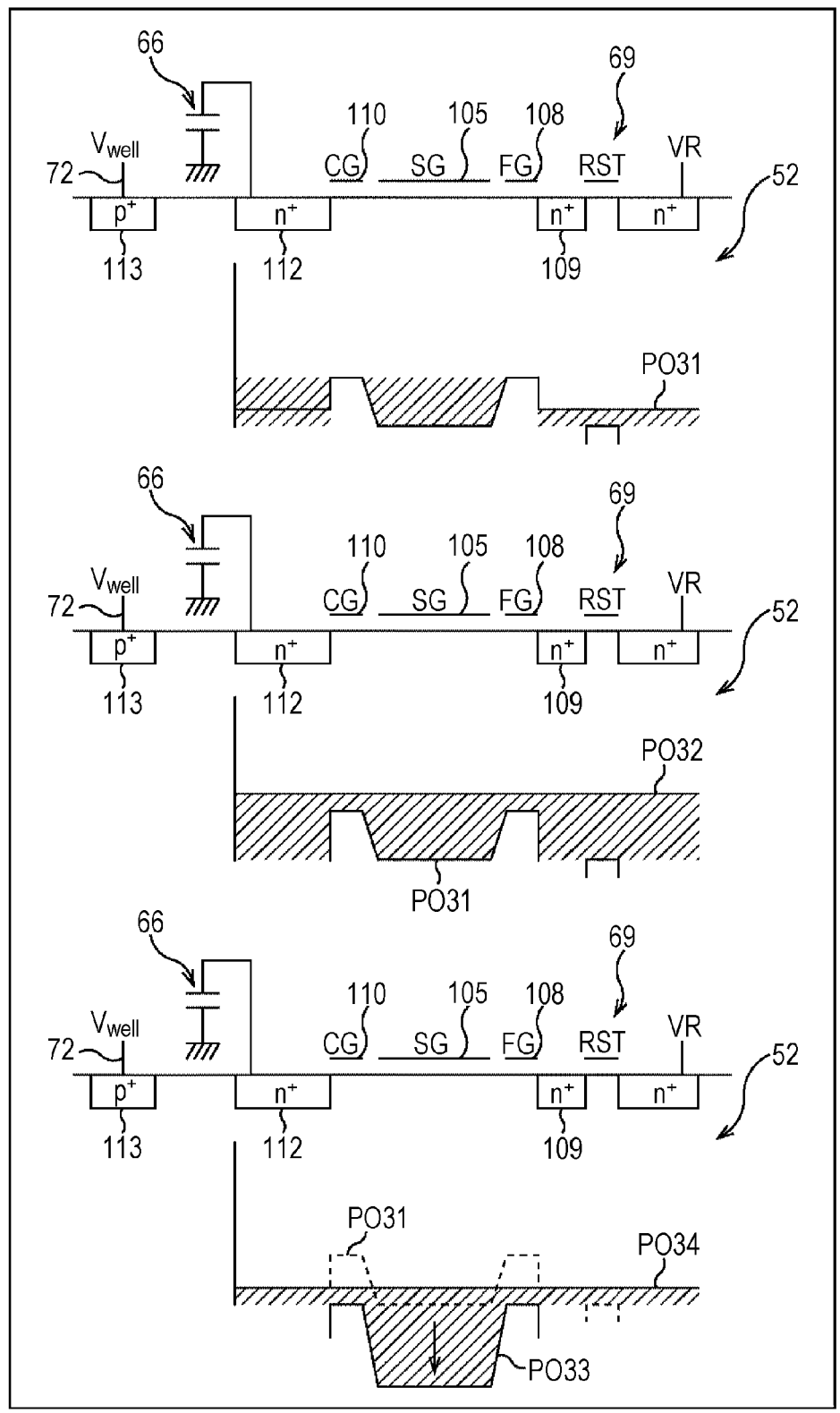
FIG. 14 is a diagram illustrating reset of the first charge accumulating unit and application of a positive bias.

In addition, as illustrated at the upper side of FIG. 14, when the reset voltage VR is high or the voltage of the driving signal CG, the driving signal FG, or the driving signal RST is low in resetting of the second charge accumulating unit 66 or the first charge accumulating unit 64 performed before exposure of the pixel, the region from the reset gate unit 69 to the second charge accumulating unit 66 is not electrically connected.

That is, as illustrated by a polygonal line PO31, if the potential of the reset gate unit 69 is low or the potential of the region right below the gate electrode 110 or the gate electrode 108 is high, the region from the reset gate unit 69 to the second charge accumulating unit 66 is not electrically connected. In this case, the initialization of the second charge accumulating unit 66 may not be performed.

The polygonal line PO31 shows the potential in each region from the second charge accumulating unit 66 to the reset gate unit 69 and a downward direction is a positive direction of the potential in the drawings. In addition, a region of a hatched portion of the upper side or the lower side of the polygonal line PO31 shows the charges accumulated in each region.

In a state illustrated at the upper side of FIG. 14, the region from the reset gate unit 69 to the second charge accumulating unit 66 is not electrically connected. For this reason, the state becomes a state in which an amount of charges accumulated in each region is unclear and the second charge accumulating unit 66 is not initialized.

Therefore, as illustrated at the center of FIG. 14, a method of decreasing the reset voltage VR (increasing the potential) and changing the potential of each region to become a state illustrated by a straight line PO32 is considered.

In this case, the region from the reset gate unit 69 to the second charge accumulating unit 66 is electrically connected, the second charge accumulating unit 66 is initialized, and the potential of each region has the same height. However, in this case, because the reset level increases as much as the potential increases, a dynamic range of the pixel may be narrowed. For this reason, this method is not preferable.

Therefore, in the present technology, the positive voltage $V_{well}$ is applied to the P-type well 52 according to necessity when the second charge accumulating unit 66 is initialized (reset) and the insufficient voltage of the gate electrode 110 or the gate electrode 108 is compensated for.

If the positive voltage $V_{well}$ is applied to the P-type well 52, a potential of a surrounding portion of the first charge accumulating unit 64 decreases from the state illustrated by the polygonal line PO31 and becomes a state illustrated by a polygonal line PO33. Thereby, the region from the reset gate unit 69 to the second charge accumulating unit 66 is electrically connected, the second charge accumulating unit 66 is initialized, and the potential of each region has the same height as illustrated by a straight line PO34.

In this case, because a level (height) of the potential illustrated by the straight line PO34 becomes lower than a level of the potential illustrated by the straight line PO32, a sufficient dynamic range can be secured. That is, as compared with the related art, the saturation signal amount of the pixel can be increased.

As such, in the case in which the first charge accumulating unit 64 or the second charge accumulating unit 66 connected to the reset gate unit 69 through one or more gates such as the third transfer gate unit 67 is initialized, if a voltage applied to the gate is insufficient, the potential of each region may not be reset to a level of the reset voltage VR. Therefore, in this technology, the positive voltage is applied to the P-type well 52 at the time of the initialization to compensate for the gate voltage and the initialization is appropriately performed while the saturation signal amount is sufficiently secured.

In addition, preferably, timing when the positive voltage $V_{well}$ is applied to the P-type well 52 is equally set to all pixels when the global driving is performed, that is, all pixels are reset at the same time and is individually set for every pixel row when rolling read to reset the pixel for every pixel row is performed. In addition, when the rolling read is performed, the region of the P-type well 52 is preferably divided in a unit of a pixel row.

A summary of the above description is as follows.

That is, recently, a power supply voltage used from a scaling rule decreases with the miniaturization of a semiconductor process. For this reason, the power supply voltage to be used in the solid-state imaging element equally decreases. However, this leads to decreasing the number of saturation signal charges that can be secured by the pixels.

Meanwhile, in a pixel in which a holding capacitor for dynamic range expansion is mounted, represented by a pixel of a LOFIC structure, not a general 4Tr-type pixel, a potential state in which gates from a reset voltage terminal to the holding capacitor are electrically connected is necessary for initializing the holding capacitor.

However, it is necessary to apply a high voltage to the gates from the reset terminal to the holding capacitor to electrically connect the gates from the reset voltage terminal to the holding capacitor. However, the voltage application becomes difficult with the minuteness of the process.

Therefore, in the present technology, in order to resolve a problem caused by a low voltage, the positive bias (voltage) is applied to the well region of the pixel and a voltage necessary for the gate is assisted, so that initialization is appropriately performed and a saturation signal amount can be increased.

[With Respect to Operation of Solid-State Imaging Element]

Figure 15:
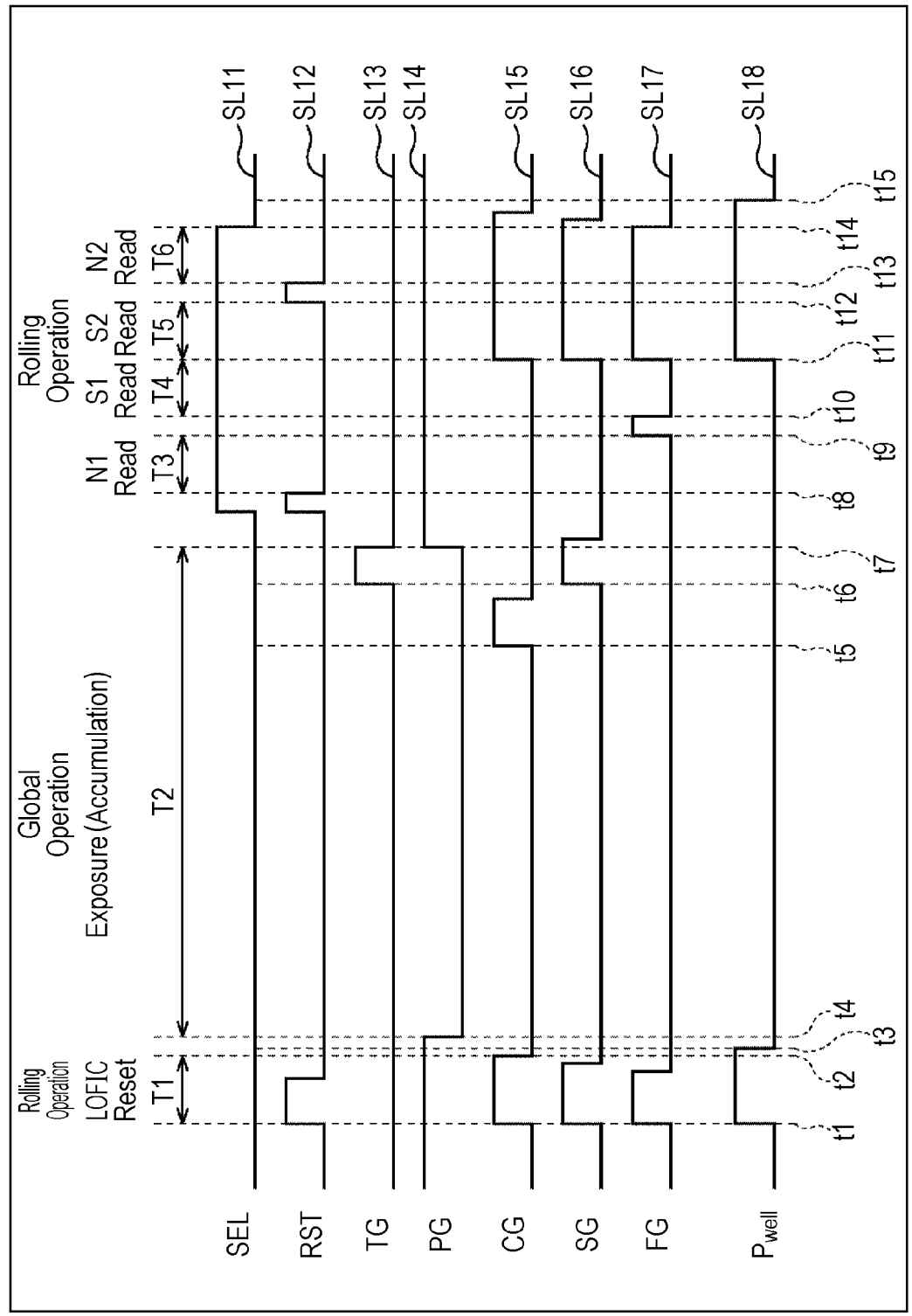
FIG. 15 is a diagram illustrating an operation of a solid-state imaging element.

Hereinafter, a specific operation of the solid-state imaging element 11 to which the present technology is applied will be described with reference to FIG. 15. FIG. 15 illustrates a state of each signal supplied to a pixel at each time. That is, in the drawing, a horizontal direction shows a time and a longitudinal direction shows a level (voltage) of each signal.

In FIG. 15, polygonal lines SL11 to SL18 show driving signals SEL, RST, TG, PG, CG, SG, FG, and a pulse $P_{well}$ to apply the positive voltage $V_{well}$ to the P-type well 52, respectively.

First, in an initial state, only the driving signal PG is turned on, that is, enters an active state and the other driving signals SEL, RST, TG, CG, SG, and FG are turned off, that is, enter an inactive state. In addition, the pulse $P_{well}$ is turned off (enters an inactive state) and a predetermined voltage becoming a reference is applied to the P-type well 52.

In this state, because the driving signal PG is turned on, a part of charges generated by receiving light by the photodiode 61 is discharged to the outside through the charge discharging gate unit 62.

Next, at a time t1, the driving signals RST, CG, SG, and FG are turned on, the pulse $P_{well}$ is turned on (enters an active state), and the positive voltage $V_{well}$ more than the predetermined voltage becoming the reference is applied to the P-type well 52. For example, on/off control of the pulse $P_{well}$ is performed by the vertical driving unit 22.

Thereby, as illustrated at a lower side of FIG. 14, the second charge accumulating unit 66, the first charge accumulating unit 64, and the charge/voltage converting unit 68 are electrically connected. As a result, a part of charges accumulated in each region is discharged to the outside through the reset gate unit 69 or the charges are injected from the outside to each region through the reset gate unit 69 and each region from the second charge accumulating unit 66 to the charge/voltage converting unit 68 is initialized (reset).

Then, if the driving signal FG is turned off after the driving signal RST is turned off, the potential right below the third transfer gate unit 67 increases and the potential is divided. For this reason, the first charge accumulating unit 64 and the charge/voltage converting unit 68 are electrically isolated.

If the driving signal SG is turned off, the potential of the first charge accumulating unit 64 increases. For this reason, the charges accumulated in the first charge accumulating unit 64 are transferred to the second charge accumulating unit 66 electrically connected.

In addition, at a time t2, if the driving signal CG is turned off, the potential right below the second transfer gate unit 65 increases and an overflow path is formed between the first charge accumulating unit 64 and the second charge accumulating unit 66.

In a period T1 between the time t1 and the time t2, the second charge accumulating unit 66 is initialized (reset), in detail, the second charge accumulating unit 66, the first charge accumulating unit 64, and the charge/voltage converting unit 68 are initialized. For example, the initialization of the second charge accumulating unit 66 is performed sequentially for every pixel row.

If the second charge accumulating unit 66 is initialized, at a time t3, the pulse $P_{well}$ is turned off and the voltage applied to the P-type well 52 changes from the voltage $V_{well}$ to the predetermined voltage becoming the reference. In addition, at a time t4, if the driving signal PG is turned off, discharge of the charges from the charge discharging gate unit 62 to the outside is stopped. For this reason, the charges obtained by the photoelectric conversion by the photodiode 61 are accumulated in the photodiode 61. That is, exposure in all pixels starts.

At this time, because the driving signal TG is turned off, an overflow path is formed between the photodiode 61 and the first charge accumulating unit 64. For this reason, if an amount of charges generated by the photodiode 61 reaches a saturation signal amount, the charges generated more than the saturation signal amount are transferred from the photodiode 61 to the first charge accumulating unit 64 and are accumulated in the first charge accumulating unit 64.

In addition, an overflow path is formed between the first charge accumulating unit 64 and the second charge accumulating unit 66. Therefore, if an amount of charges accumulated in the first charge accumulating unit 64 reaches the saturation signal amount, the charges transferred more than the saturation signal amount are further transferred to the second charge accumulating unit 66 and are accumulated in the second charge accumulating unit 66.

At a time t5, if the driving signal CG is turned on, the potential right below the second transfer gate unit 65 decreases. For this reason, the charges accumulated in the first charge accumulating unit 64 are transferred to the second charge accumulating unit 66. Then, the driving signal CG is turned off.

In addition, at a time t6, the driving signal TG and the driving signal SG are turned on. In this case, the potential of the first charge accumulating unit 64 decreases, the potential right below the first transfer gate unit 63 decreases, and the charges accumulated in the photodiode 61 are transferred to the first charge accumulating unit 64.

At this point of time, the charges obtained in an exposure period are accumulated in the first charge accumulating unit 64 and the second charge accumulating unit 66.

At a time t7, the driving signal TG is turned off and the driving signal PG is turned on. Thereby, transferring of the charges from the photodiode 61 to the first charge accumulating unit 64 is stopped and the charges of the photodiodes 61 are discharged to the outside. A period T2 from the time t4 to the time t7 is an exposure period and exposure of all pixels is performed simultaneously during the same period in the exposure period.

Then, the driving signal SG is turned off and the potential of the first charge accumulating unit 64 increases. In addition, the driving signal SEL is turned on, the pixel is selected, the driving signal RST is turned on, and the potential of the charge/voltage converting unit 68 is reset to a level of the reset voltage VR.

At a time t8, if the driving signal RST is turned off and the reset of the charge/voltage converting unit 68 ends, first reset level read is performed. That is, the potential of the charge/voltage converting unit 68 is read as a first reset level N1 to the column processing unit 23 through the amplification transistor 70, the selection transistor 71, and the vertical signal line 27.

Next, at a time t9, the driving signal FG is turned on, the potential right below the third transfer gate unit 67 decreases, and the first charge accumulating unit 64 and the charge/voltage converting unit 68 are electrically connected. Thereby, the charges of the first charge accumulating unit 64 are transferred to the charge/voltage converting unit 68 through the third transfer gate unit 67. That is, transferring of the charges by the third transfer gate unit 67 is performed and the transferred charges are accumulated in the charge/voltage converting unit 68.

A period T3 from the time t8 to the time t9 becomes a first reset level read period in which the first reset level N1 is read.

At a time t10, if the driving signal FG is turned off, the potential right below the third transfer gate unit 67 increases, and the first charge accumulating unit 64 and the charge/voltage converting unit 68 are electrically isolated, first signal level read is performed.

That is, the potential of the charge/voltage converting unit 68 is read as the first signal level S1 to the column processing unit 23 through the amplification transistor 70, the selection transistor 71, and the vertical signal line 27. In addition, a difference of the first reset level N1 and the first signal level S1 becomes a value of a first pixel signal. That is, the difference of the potentials that are changed according to the charges transferred from the first charge accumulating unit 64 to the charge/voltage converting unit 68 becomes the value of the first pixel signal.

At a time t11, the driving signals CG, SG, and FG are turned on, the pulse $P_{well}$ is turned on (enters an active state), and the positive voltage $V_{well}$ is applied to the P-type well 52.

Thereby, the potentials right below the second transfer gate unit 65 and the third transfer gate unit 67 decrease and the potentials of the first charge accumulating unit 64, the second charge accumulating unit 66, and the charge/voltage converting unit 68 are coupled. That is, the first charge accumulating unit 64, the second charge accumulating unit 66, and the charge/voltage converting unit 68 are electrically connected. At this time, assistance of the voltage application to the gate electrodes of the second transfer gate unit 65 and the third transfer gate unit 67 is performed by applying the positive voltage $V_{well}$ to the P-type well 52.

A period T4 from the time t10 to the time t11 becomes the first signal level read period in which the first signal level S1 is read.

At the time t11, if the first charge accumulating unit 64, the second charge accumulating unit 66, and the charge/voltage converting unit 68 are electrically connected, the charges accumulated in the second charge accumulating unit 66 and the charge/voltage converting unit 68 are accumulated in the first charge accumulating unit 64, the second charge accumulating unit 66, and the charge/voltage converting unit 68. That is, the charges are accumulated over the entire regions of the first charge accumulating unit 64, the second charge accumulating unit 66, and the charge/voltage converting unit 68 of which the potentials are coupled.

In this case, the potential of the charge/voltage converting unit 68 is read as a second signal level S2 to the column processing unit 23 through the amplification transistor 70, the selection transistor 71, and the vertical signal line 27. That is, second signal level read is performed.

Next, at a time t12, the driving signal RST is turned on and a part of the charges of the first charge accumulating unit 64, the second charge accumulating unit 66, and the charge/voltage converting unit 68 is discharged to the outside through the reset gate unit 69 and these regions are reset. A period T5 from the time t11 to the time t12 becomes a second signal level read period in which the second signal level S2 is read.

At a time t13, if the driving signal RST is turned off and the reset of the first charge accumulating unit 64, the second charge accumulating unit 66, and the charge/voltage converting unit 68 ends, second reset level read is performed. That is, the potential of the charge/voltage converting unit 68 is read as the second reset level N2 to the column processing unit 23 through the amplification transistor 70, the selection transistor 71, and the vertical signal line 27.

At a time t14, the driving signal SEL is turned off, selection of the pixel is released, the driving signal FG is turned off, the potential right below the third transfer gate unit 67 increases, and the potentials of the first charge accumulating unit 64 and the charge/voltage converting unit 68 are divided. That is, the first charge accumulating unit 64 and the charge/voltage converting unit 68 are electrically isolated.

A period T6 from the time t13 to the time t14 becomes a second reset level read period in which the second reset level N2 is read.

A difference of the second reset level N2 and the second signal level S2 read as described above becomes a value of the second pixel signal. That is, the first charge accumulating unit 64, the second charge accumulating unit 66, and the charge/voltage converting unit 68 are electrically connected and a difference of the potentials changed when the entire regions are reset from a state in which the charges are accumulated in the entire regions becomes the value of the second pixel signal.

In addition, in the signal processing unit 28, a final pixel value of the pixel, that is, a pixel signal value is determined on the basis of the read first and second pixel signals. For example, when a first pixel signal value is less than a predetermined value, that is, saturation of a signal is not generated by low illumination, the first pixel signal becomes a final pixel signal.

Meanwhile, when the first pixel signal value is equal to or more than the predetermined threshold value, that is, the saturation of the signal is generated by high illumination, a value of the product of gain acquired from the first pixel signal and the second pixel signal and the second pixel signal becomes the final pixel signal.

At a time t14, if the driving signal SEL and the driving signal FG are turned off, the driving signal SG is turned off. In this case, because the potential of the first charge accumulating unit 64 increases, the charges accumulated in the first charge accumulating unit 64 are transferred to the second charge accumulating unit 66 electrically connected.

Then, if the driving signal CG is turned off, the potential right below the second transfer gate unit 65 increases and an overflow path is formed between the first charge accumulating unit 64 and the second charge accumulating unit 66.

At a time t15, the pulse $P_{well}$ is turned off and the voltage applied to the P-type well 52 changes from the voltage $V_{well}$ to the predetermined voltage becoming the reference. A process that is executed after the driving signal SG is turned off after the time t7 is a process executed for every pixel row.

In this way, the solid-state imaging element 11 receives light from the subject, executes photoelectric conversion on the light, and images an image. At this time, at the time of initializing the second charge accumulating unit 66 in the period T1, reading the second signal level in the period T5, and reading the second reset level in the period T6 in particular, the positive voltage $V_{well}$ is applied to the P-type well 52, thereby decreasing the voltage and increasing the saturation signal amount.

That is, the solid-state imaging element 11 applies the positive voltage to the P-type well 52 and alleviates a gate voltage necessary for initialization of a semiconductor element such as the first charge accumulating unit 64 and the second charge accumulating unit 66 electrically isolated from the reset gate unit 69 to discharge or inject the charges, by one or more gates such as the third transfer gate unit 67. Thereby, even when a voltage to drive the solid-state imaging element 11 is low, the sufficient saturation signal amount can be secured and the semiconductor element can be initialized (reset).

If the positive voltage applied to the P-type well 52 increases, an assistance effect for the initialization of the semiconductor element such as the first charge accumulating unit 64 increases. However, if the voltage applied to the P-type well 52 is excessively high, a forward bias is applied between the P-type well 52 and a node in which a voltage is lowest in the pixel, which may result in exerting a bad influence on the pixel.

For example, the node in which the voltage may be lowest in the pixel is the vertical signal line 27 that becomes a source of the selection transistor 71. For this reason, when the positive voltage $V_{well}$ is applied to the P-type well 52, at timing when the voltage $V_{well}$ is applied, a positive voltage lower than the voltage applied to the vertical signal line 27 may be set as the voltage $V_{well}$.

In addition, the timing when the positive voltage $V_{well}$ is applied to the P-type well 52 may be equally set to all pixels or may be different for every pixels such as a pixel row and a pixel block.

In addition, the positive voltage may be applied to each P-type well 52 provided with each pixel and the positive voltage may be applied to the P-type well 52 for every pixel row or every block unit including some pixels.

In the above description, the first charge accumulating unit 64 or the second charge accumulating unit 66 corresponding to the semiconductor element to be initialized is the capacitor. However, when the semiconductor element is the capacitor, the capacitor may have any structure.

For example, the capacitor to be the semiconductor element may have a metal-insulation layer-metal (MIM) structure in which an insulation layer (insulator) is interposed by a metal and a metal or may have a polysilicon-insulation layer-metal (PIM) structure in which an insulation layer is interposed by polysilicon and a metal. In addition, the capacitor to be the semiconductor element may have a polysilicon-insulation layer-polysilicon (PIP) structure in which an insulation layer is interposed by polysilicon and polysilicon.

<Third Embodiment>
[Configuration Example of Pixel]

A solid-state imaging element 11 may be a sensor in which a capacitor is provided in the vicinity of a charge/voltage converting unit 68 in a pixel of a pixel array unit 21 and gain of the charge/voltage converting unit 68 is variable.

Figure 16:
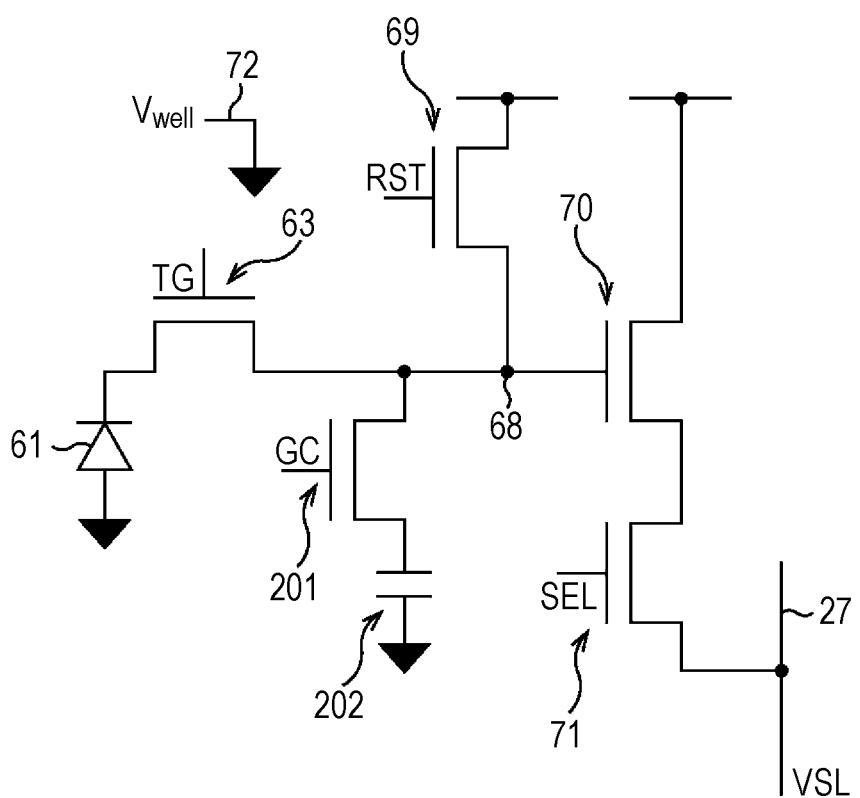
FIG. 16 is a diagram illustrating another configuration example of the pixel.

In this case, pixels configuring the pixel array unit 21 are configured as illustrated in FIG. 16. In FIG. 16, portions corresponding to those in the case of FIG. 3 are denoted by the same reference numerals and explanation thereof is appropriately omitted.

In FIG. 16, a pixel of the pixel array unit 21 includes a photodiode 61, a first transfer gate unit 63, a gain control gate unit 201, a charge accumulating unit 202, a charge/voltage converting unit 68, a reset gate unit 69, an amplification transistor 70, and a selection transistor 71. In addition, a connection line 72 that is connected to a power supply not illustrated in the drawing and applies a positive voltage $V_{well}$ to a P-type well 52 of the pixel is connected to the pixel through a contact not illustrated in the drawing.

In an example of FIG. 16, the photodiode 61 is connected to the charge/voltage converting unit 68 through the first transfer gate unit 63. In addition, the reset gate unit 69 is connected to the charge/voltage converting unit 68 and the vertical signal line 27 is also connected to the charge/voltage converting unit 68 through the amplification transistor 70 and the selection transistor 71.

The charge accumulating unit 202 to be a capacitor to accumulate charges is also connected to the charge/voltage converting unit 68 through the gain control gate unit 201. A driving signal GC is supplied to a gate electrode configuring the gain control gate unit 201. The driving signal GC becomes a pulse signal in which a high-level state becomes an active state (on state) and a low-level state becomes an inactive state (off state).

For example, if the driving signal GC is turned on, a potential right below the gain control gate unit 201 decreases and potentials of the charge/voltage converting unit 68 and the charge accumulating unit 202 are coupled. That is, the charge/voltage converting unit 68 and the charge accumulating unit 202 are electrically connected.

Meanwhile, if the driving signal GC is turned off, the potential right below the gain control gate unit 201 increases and the potentials of the charge/voltage converting unit 68 and the charge accumulating unit 202 are divided. That is, the charge/voltage converting unit 68 and the charge accumulating unit 202 are electrically isolated.

Therefore, the driving signal GC is turned on or turned off, so that sensitivity of the pixel can be changed. Specifically, if a change amount in the accumulated charges is set to $\Delta Q$, a voltage change at that time is set to $\Delta V$, and a capacity value is set to C, a relation of $\Delta V = \Delta Q/C$ is realized.

If a capacity value of the charge/voltage converting unit 68 is set to $C_{FD}$ and a capacity value of the charge accumulating unit 202 is set to $C_{CAP}$, a capacity value C in a region of a pixel in which read of a signal level is performed is $C_{FD}+C_{CAP}$, in a state in which the driving signal GC is turned on. Meanwhile, if the driving signal GC is turned off, the capacity value C changes to $C_{FD}$. For this reason, sensitivity of a voltage (a change amount of the voltage) for a change amount of the charges increases.

As such, in the solid-state imaging element 11, the driving signal GC is turned on or turned off, so that the sensitivity of the pixel is appropriately changed. For example, if the driving signal GC is turned on, the charge accumulating unit 202 is electrically connected to the charge/voltage converting unit 68. In this case, a part of the charges transferred from the photodiode 61 to the charge/voltage converting unit 68 is accumulated in the charge accumulating unit 202.

[With Respect to Operation of Solid-State Imaging Element]

However, in the pixel illustrated in FIG. 16, it is necessary to reset (initialize) the charge accumulating unit 202 through at least one or more gates when an image is imaged. Specifically, it is necessary to change a state to an initial state by turning on the driving signal RST of the reset gate unit 69 and the driving signal GC of the gain control gate unit 201 and electrically connecting the charge accumulating unit 202 and the charge/voltage converting unit 68.

However, as described above, when a high voltage cannot be used in the driving signal RST or the driving signal GC, opening of a gate of one side or both sides of the reset gate unit 69 and the gain control gate unit 201 may be insufficient. That is, because potentials right below these gates cannot be sufficiently decreased and initialization cannot be performed, the number of saturation signal charges may decrease.

Figure 17:
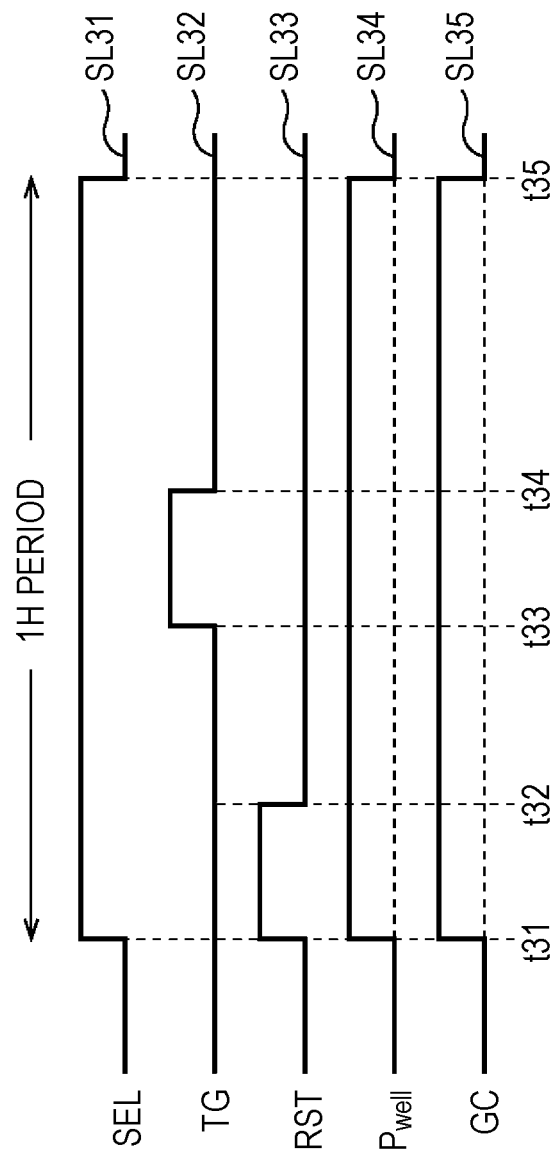
FIG. 17 is a diagram illustrating an operation of the solid-state imaging element.

Therefore, in the solid-state imaging element 11, for example, as illustrated in FIG. 17, when the solid-state imaging element 11 is driven and a signal in which conversion efficiency in a pixel decreases is read, a positive voltage $V_{well}$ is applied to the P-type well 52, such that initialization (reset) of the charge accumulating unit 202 is assisted.

FIG. 17 illustrates a state of a signal supplied to a pixel at each time. That is, in the drawing, a horizontal direction shows a time and a longitudinal direction shows a level (voltage) of each signal. In addition, polygonal lines SL31 to SL35 show driving signals SEL, TG, RST, a pulse $P_{well}$, and a driving signal GC, respectively.

In an example of FIG. 17, when an imaging operation of an image starts, the driving signals SEL, TG, RST, and GC are turned off. In addition, the pulse $P_{well}$ is also turned off (enters an inactive state) and a predetermined voltage becoming a reference is applied to the P-type well 52.

Then, at a time t31, the driving signal SEL is turned on, the pixel is selected, the driving signal GC is turned on, and the charge accumulating unit 202 and the charge/voltage converting unit 68 are electrically connected. In addition, the driving signal RST is turned on, the charge accumulating unit 202 and the charge/voltage converting unit 68 are reset, and the pulse $P_{well}$ is turned on.

Thereby, the charges are discharged or injected through the reset gate unit 69 and the potentials of the regions of the charge accumulating unit 202 and the charge/voltage converting unit 68 are reset to the predetermined values. At this time, because the positive voltage $V_{well}$ is applied to the P-type well 52, the potential of the region right below the reset gate unit 69 or the gain control gate unit 201 is sufficiently decreased and initialization of the region of the charge accumulating unit 202 or the charge/voltage converting unit 68 is assisted.

At a time t32, if the driving signal RST is turned off and reset of the charge accumulating unit 202 and the charge/voltage converting unit 68 ends, read of a reset level is performed. That is, the potential of the charge/voltage converting unit 68 is read as the reset level to the column processing unit 23 through the amplification transistor 70, the selection transistor 71, and the vertical signal line 27.

At a time t33, the driving signal TG is turned on. In this case, the potential right below the first transfer gate unit 63 decreases and the charges accumulated in the photodiode 61 are transferred to the charge/voltage converting unit 68 and the charge accumulating unit 202.

In addition, at a time t34, the driving signal TG is turned off and transferring of the charges from the photodiode 61 to the charge/voltage converting unit 68 is stopped.

Then, read of the signal level is performed. That is, the potential of the charge/voltage converting unit 68 is read as the signal level to the column processing unit 23 through the amplification transistor 70, the selection transistor 71, and the vertical signal line 27. In addition, in the column processing unit 23, a difference of the reset level and the signal level read as described above becomes a value of a pixel signal.

At a time t35, the driving signal SEL is turned off, the selection of the pixel is released, the driving signal GC is turned off, and the charge/voltage converting unit 68 and the charge accumulating unit 202 are electrically isolated. In addition, the pulse $P_{well}$ is turned off and the voltage applied to the P-type well 52 changes from the voltage $V_{well}$ to the predetermined voltage becoming the reference.

A period from the time t31 to the time t35 is one horizontal read period in which a pixel signal is read from each pixel configuring a pixel row.

In this way, the solid-state imaging element 11 applies the positive voltage to the P-type well 52 and assists initialization of the charge accumulating unit 202, in a horizontal read period in which a pixel signal is read. Thereby, gate voltages necessary for driving the gain control gate unit 201 and the reset gate unit 69, that is, voltages of the driving signals GC and RST can be alleviated. In addition, even when a voltage to drive the solid-state imaging element 11 is low, a sufficient saturation signal amount can be secured.

In an example of FIG. 17, control is performed such that the pulse $P_{well}$ is turned on in only the horizontal read period, and the positive voltage $V_{well}$ is applied to the P-type well 52. However, the pulse $P_{well}$ may be turned on at all times.

<Modification of Third Embodiment>
[With Respect to Operation of Solid-State Imaging Element]

Figure 18:
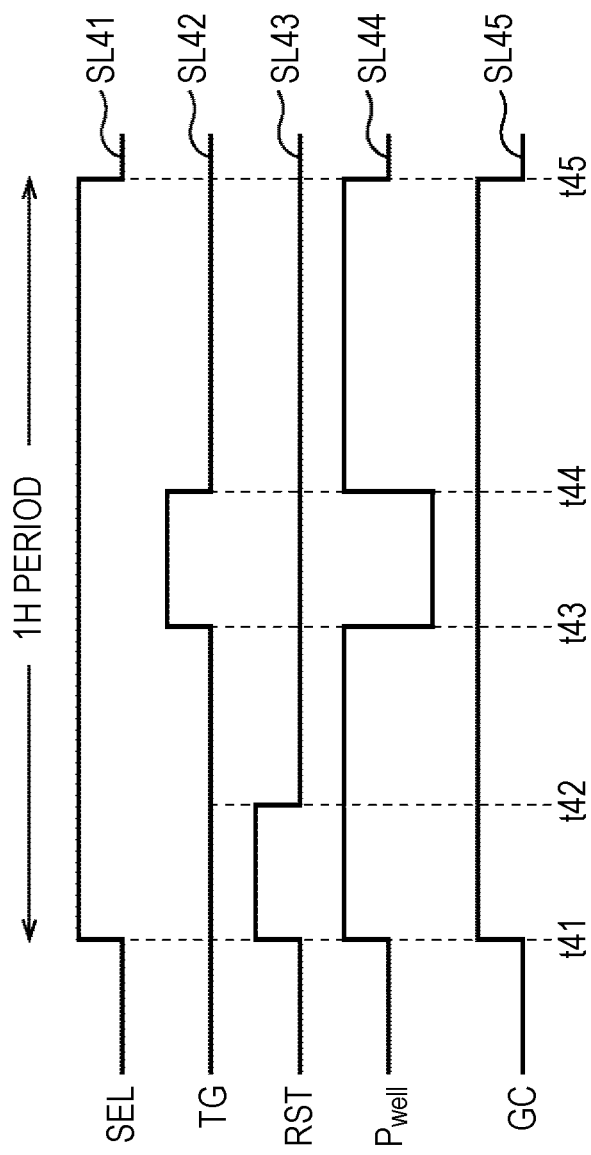
FIG. 18 is a diagram illustrating an operation of the solid-state imaging element.

In addition, for example, as illustrated in FIG. 18, a negative voltage may be applied to the P-type well 52 when the charges are transferred from the photodiode 61 to the charge/voltage converting unit 68 and assistance of the charge transfer may be performed.

FIG. 18 illustrates a state of each signal supplied to a pixel at each time. That is, in the drawing, a horizontal direction shows a time and a longitudinal direction shows a level (voltage) of each signal. In addition, polygonal lines SL41 to SL45 show driving signals SEL, TG, RST, a pulse $P_{well}$, and a driving signal GC, respectively.

In an example of FIG. 18, an operation until just before a time t43 after the imaging operation of the image starts is the same as the operation until just before the time t33 in FIG. 17. That is, at the time t41, the driving signals SEL, RST, and GC are turned on and the pulse $P_{well}$ is turned on. In addition, at the time t42, the driving signal RST is turned off and a reset level is read.

At the time t43, the driving signal TG is turned on, a level of the pulse $P_{well}$ becomes a level lower than a level at the time of turning off, and a negative voltage lower than the predetermined voltage becoming the reference is applied to the P-type well 52. Application of the negative voltage to the P-type well 52 by the pulse $P_{well}$ is performed by the vertical driving unit 22 through the connection line 72.

If the driving signal TG is turned on, the potential right below the first transfer gate unit 63 decreases and the charges accumulated in the photodiode 61 are transferred to the charge/voltage converting unit 68 and the charge accumulating unit 202.

At this time, the negative voltage is applied to the P-type well 52, the potential of the portion of the photodiode 61 becomes higher than the potential right below the first transfer gate unit 63, and charge transfer is assisted. That is, a large amount of charges are transferred from the photodiode 61 to the charge/voltage converting unit 68. In other words, the charges remaining without being transferred in the related art are also transferred to the charge/voltage converting unit 68.

At a time t44, the driving signal TG is turned off, transferring of the charges from the photodiode 61 to the charge/voltage converting unit 68 is stopped, the pulse $P_{well}$ is turned on, and assistance of the charge transfer is also stopped. Then, the same operation as the operation after the time t34 of FIG. 17 is executed.

That is, after the time t44, read of the signal level is performed. At a time t45, the driving signals SEL and GC are turned off, the pulse $P_{well}$ is turned off, and the voltage applied to the P-type well 52 changes from the voltage $V_{well}$ to the predetermined voltage becoming the reference.

In this way, the solid-state imaging element 11 assists the initialization by applying the positive voltage to the P-type well 52 when the charge accumulating unit 202 is initialized and assists the transfer by applying the negative voltage to the P-type well 52 when the charges are transferred to the charge/voltage converting unit 68. Thereby, the voltage of the pixel can be decreased and the saturation signal amount can be increased.

Figure 19:
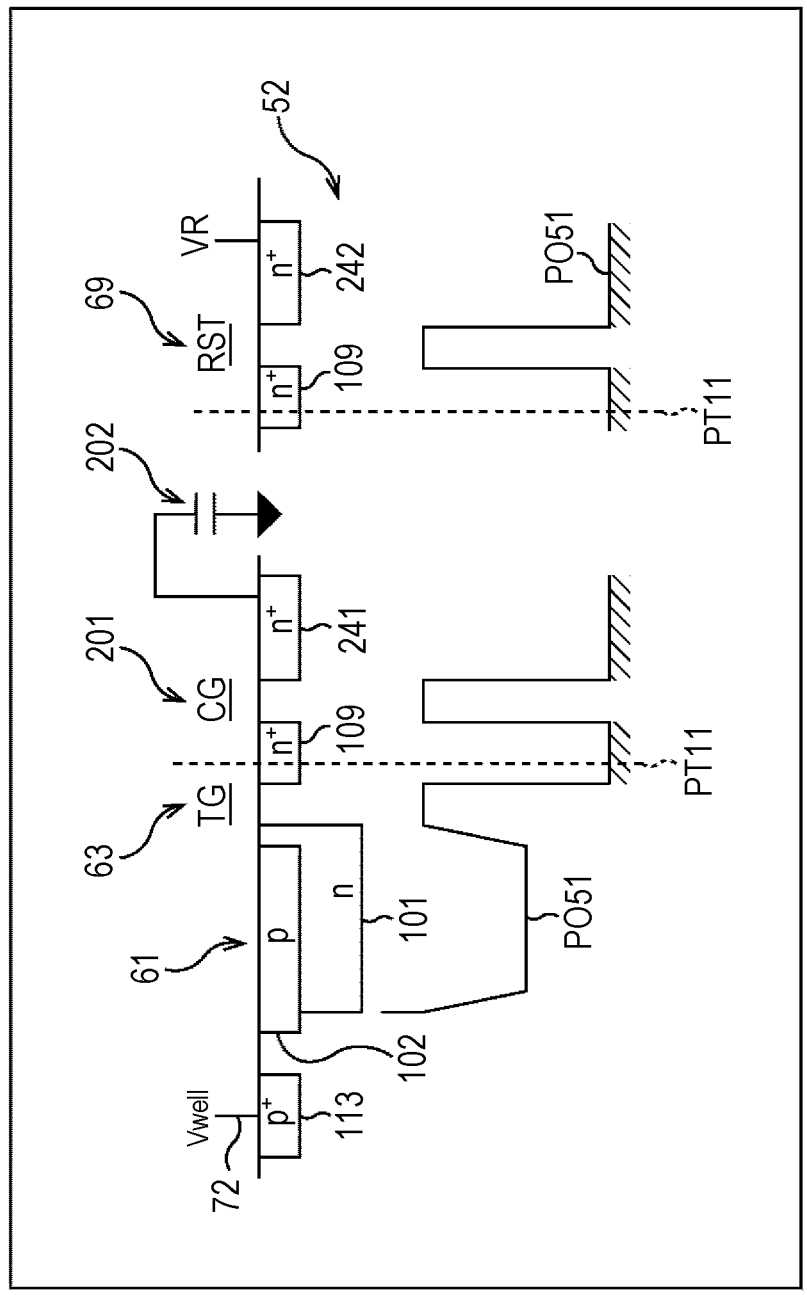
FIG. 19 is a diagram illustrating a potential of each region of the pixel.
Figure 20:
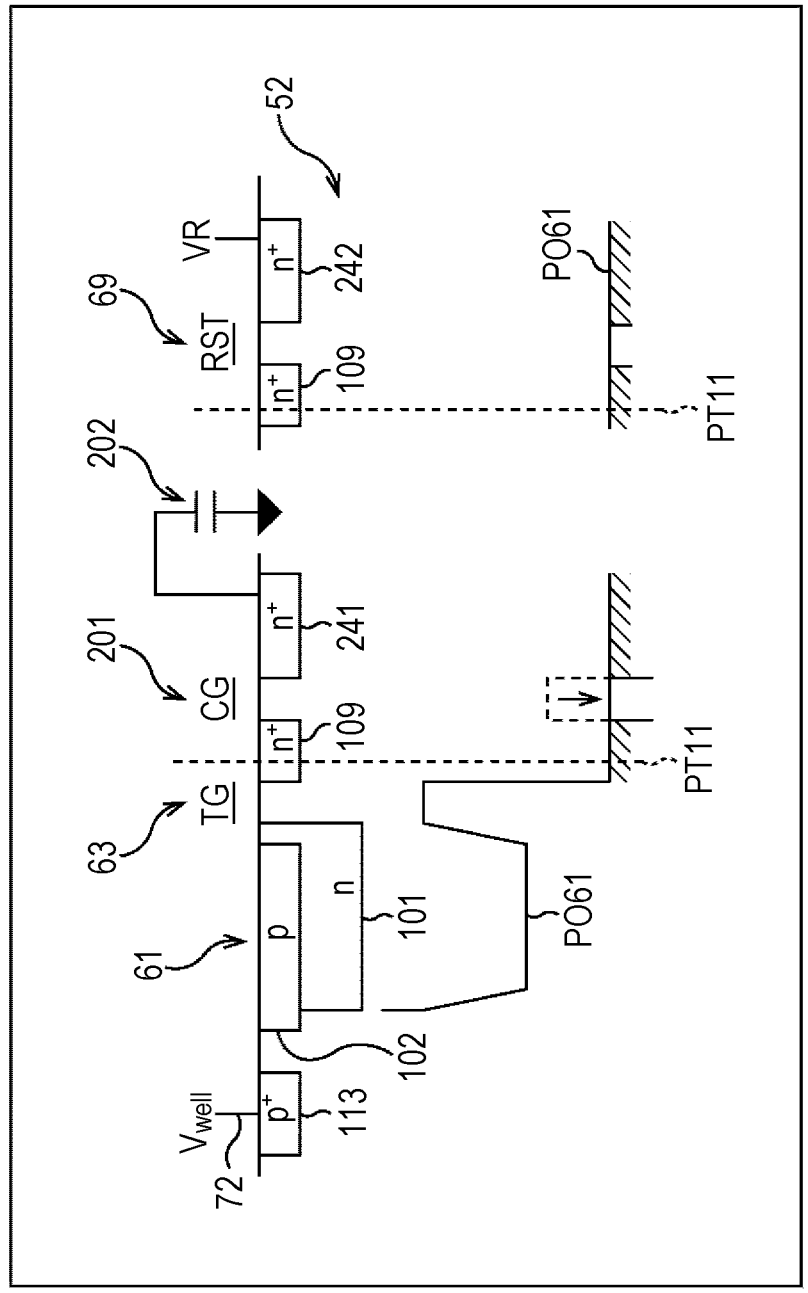
FIG. 20 is a diagram illustrating a potential of each region of the pixel.
Figure 21:
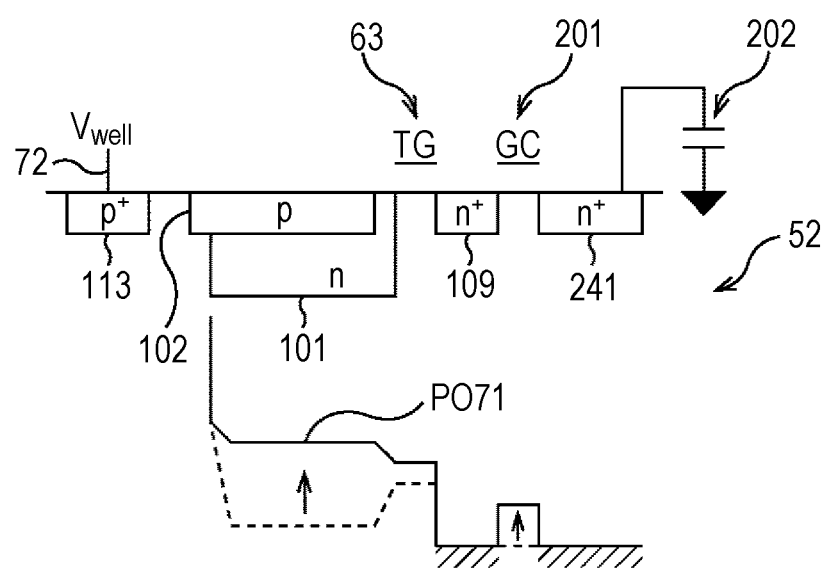
FIG. 21 is a diagram illustrating a potential of each region of the pixel.

Here, a change of a potential of each region of a pixel at the time of performing driving illustrated in FIG. 18 will be described with reference to FIGS. 19 to 21. In FIGS. 19 to 21, portions corresponding to those in the case of FIG. 10 or 16 are denoted with the same reference numerals and explanation thereof is appropriately omitted.

In FIG. 19, a polygonal line PO51 shows a potential in each region of a pixel and two dotted lines PT11 show the same position, specifically, a position of an $N^+$-type semiconductor region 109 becoming the charge/voltage converting unit 68.

For example, at a right side of the dotted line PT11 at a right side in the drawing, regions of the charge/voltage converting unit 68 and the reset gate unit 69 connected to the charge/voltage converting unit 68 and potentials of the regions are illustrated. In addition, at a right side of the dotted line PT11 at a left side in the drawing, regions of the charge/voltage converting unit 68 and the charge accumulating unit 202 connected to the charge/voltage converting unit 68 and potentials of the regions are illustrated.

In FIG. 19, a capacitor becoming the charge accumulating unit 202 is connected to a right side of the gain control gate unit 201 in the P-type well 52 through an N+-type semiconductor region 241 configuring the charge accumulating unit 202. In addition, the reset gate unit 69 is connected to a reset power supply VR through an N+-type semiconductor region 242.

A state of the potential illustrated in FIG. 19 shows a potential of each region of a pixel in a state of a time before the time t41 in FIG. 18, that is, a state in which the driving signals SEL, TG, RST, and GC are turned off and the pulse $P_{well}$ is also turned off.

In this state, the photodiode 61 and the N+-type semiconductor region 109 becoming the charge/voltage converting unit 68 are electrically isolated. In addition, the N+-type semiconductor region 109 and the N+-type semiconductor region 241 and the N+-type semiconductor region 109 and the N+-type semiconductor region 242 are also electrically isolated.

In addition, at the time t41, if the driving signals SEL, RST, and GC are turned on and the pulse $P_{well}$ is turned on, the potential of each region is as illustrated by a polygonal line PO61 of FIG. 20.

That is, a potential right below the gain control gate unit 201 decreases from a potential state illustrated by a dotted line and becomes a potential illustrated by a polygonal line PO61. That is, a level of the potential right below the gain control gate unit 201 becomes the same level as levels of potentials of the N+-type semiconductor region 109 and the N+-type semiconductor region 241 by applying the positive voltage to the P-type well 52.

As illustrated at a right side in the drawing, levels of the potentials of the N+-type semiconductor region 109, the region right below the reset gate unit 69, and the N+-type semiconductor region 242 become the same.

As such, if the charge/voltage converting unit 68 and the charge accumulating unit 202 are electrically connected, the charge/voltage converting unit 68 and the charge accumulating unit 202 are initialized. At this time, the potential level of each region of the charge/voltage converting unit 68, the region right below the gain control gate unit 201, and the charge accumulating unit 202 becomes the same. Therefore, the charges of the charge accumulating unit 202 can be prevented from remaining without being discharged or the charges necessary for the charge accumulating unit 202 can be prevented from being not injected.

In addition, at the time t43, if the driving signal TG is turned on and the negative voltage is applied to the P-type well 52, the potential of each region is as illustrated by a polygonal line PO71 of FIG. 21.

That is, if the potentials of the photodiode 61 and the region right below the first transfer gate unit 63 increase from a potential state illustrated by a dotted line and become a potential illustrated by a polygonal line PO71. In addition, the potential right below the gain control gate unit 201 also increases from the potential state illustrated by the dotted line and becomes the potential illustrated by the polygonal line PO71.

In this example, before the assistance to the transfer is performed, the potential of the region right below the first transfer gate unit 63 becomes higher than the potential of the photodiode 61. The potential of the photodiode 61 becomes higher than the potential of the region right below the first transfer gate unit 63 by the assistance to the transfer. As a result, all charges accumulated in the photodiode 61 are transferred to the charge/voltage converting unit 68.

In FIG. 21, the potential right below the gain control gate unit 201 is increased by applying the negative voltage (negative bias) to the P-type well 52. However, when a signal level is read, the potential is decreased by applying the positive bias to the P-type well 52.

That is, at the time t44, if the positive voltage is applied to the P-type well 52, the potential right below the gain control gate unit 201 becomes a level at the time of the initialization, that is, a level of the potential right below the gain control gate unit 201 illustrated in FIG. 20.

As such, even when the sensitivity (gain) of the pixel is changed, the positive voltage is applied to the well region of the pixel when the element in the pixel is reset, so that the voltage of the pixel can be decreased and the saturation signal amount can be increased.

The two examples of the case in which the pixel has the LOFIC structure and the case in which the gain of the charge/voltage conversion is changed in the pixel have been described. However, the present technology can be applied to all pixels in which an element to be initialized by an external reset voltage exists in a pixel unit.

[Configuration Example of Imaging Apparatus]

In addition, the present technology can be applied to all electronic apparatuses in which a solid-state imaging element is used in an image reading unit (photoelectric converting unit), such as an imaging apparatus such as a digital still camera and a video camera, a portable terminal device having an imaging function, and a copy machine in which the solid-state imaging element is used in the image reading unit. The solid-state imaging element may be formed as form of a single chip and may be formed as a form of a module having an imaging function in which an imaging unit and a signal processing unit or an optical system are collected and packaged.

Figure 22:
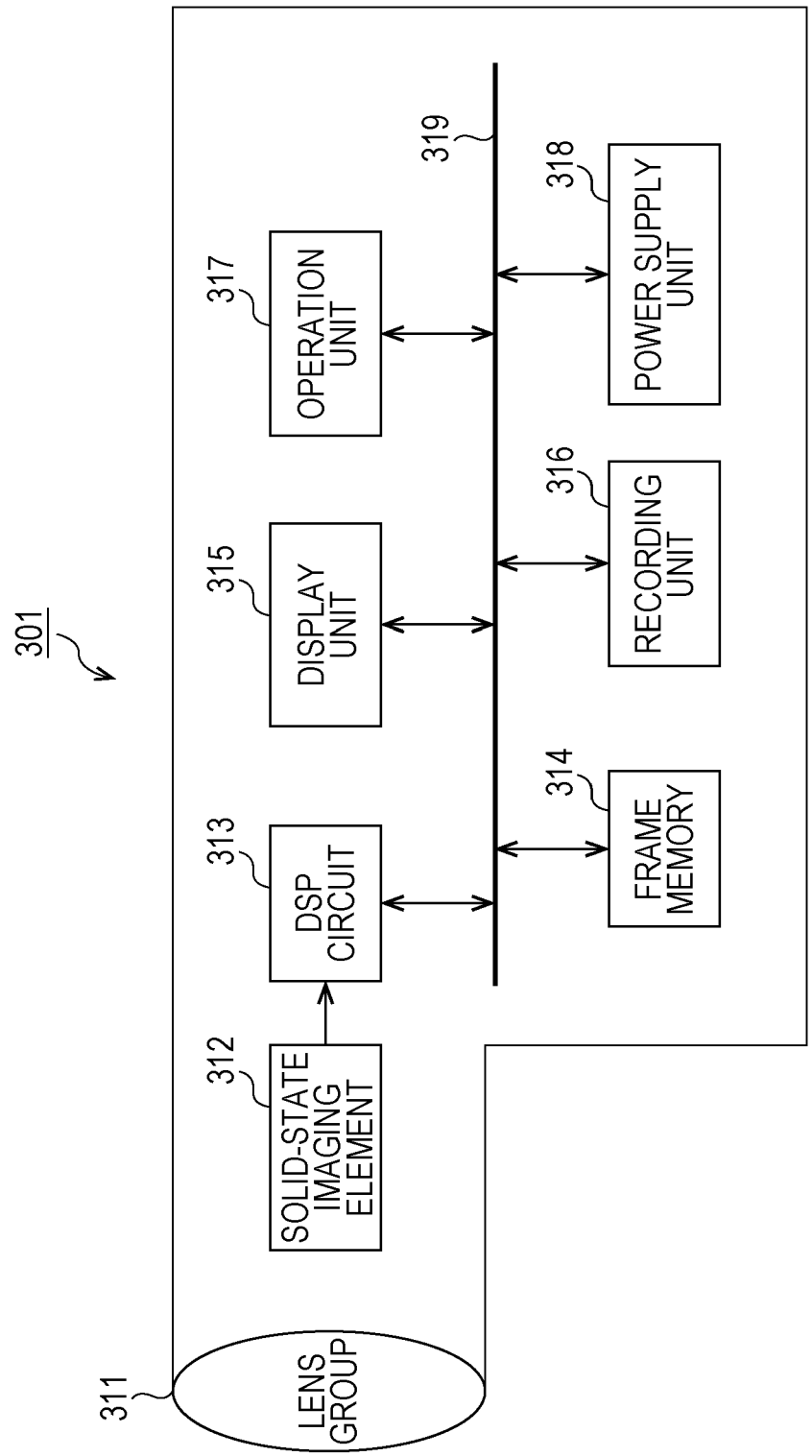
FIG. 22 is a diagram illustrating a configuration example of an imaging apparatus.

FIG. 22 is a diagram illustrating a configuration example of an imaging apparatus corresponding to an electronic apparatus to which the present technology is applied.

An imaging apparatus 301 of FIG. 22 includes an optical unit 311 configured from a lens group, a solid-state imaging element (imaging device) 312, and a digital signal processor (DSP) circuit 313 to be a camera signal processing circuit. In addition, the imaging apparatus 301 includes a frame memory 314, a display unit 315, a recording unit 316, an operation unit 317, and a power supply unit 318. The DSP circuit 313, the frame memory 314, the display unit 315, the recording unit 316, the operation unit 317, and the power supply unit 318 are connected mutually by a bus line 319.

The optical unit 311 receives incidence light (image light) from a subject and forms an image on an imaging surface of the solid-state imaging element 312. The solid-state imaging element 312 converts an amount of the incidence light forming the image on the imaging surface by the optical unit 311 into an electric signal in a unit of a pixel and outputs the electric signal as a pixel signal. The solid-state imaging element 312 corresponds to the solid-state imaging element 11 described above.

The display unit 315 is configured from a panel-type display device such as a liquid crystal panel or an organic electro luminescence (EL) panel and displays a moving image or a still image imaged by the solid-state imaging element 312. The recording unit 316 records the moving image or the still image imaged by the solid-state imaging element 312 on a recoding medium such as a video tape or a digital versatile disk (DVD).

The operation unit 317 outputs an operation command for various functions of the imaging apparatus 301, under an operation by a user. The power supply unit 318 appropriately supplies various power supplies becoming operation power supplies of the DSP circuit 313, the frame memory 314, the display unit 315, the recording unit 316, and the operation unit 317 to supply targets.

In addition, in the embodiments described above, the example of the case in which the present technology is applied to a CMOS image sensor obtained by arranging pixels detecting signal charges according to an amount of visible light as a physical amount in a matrix has been described. However, the present technology is not limited to the application to the CMOS image sensor and can be applied to all solid-state imaging elements.

In addition, the present technology is not limited to the application to the solid-state imaging element that detects a distribution of an incidence amount of the visible light and images the distribution as an image and can be applied to a solid-state imaging element that images a distribution of an incidence amount of infrared rays, X-rays, or particles as an image.

In addition, embodiments of the present technology are not limited to the embodiments described above and various changes can be made without departing from the scope of the present technology.

The present technology can take the following configurations.

[1] An imaging element including:
a pixel unit that includes multiple pixels arranged in a matrix; and
a driving unit that drives the pixel unit,
wherein the pixel has a converting unit that converts a physical amount into charges in a conversion period, a charge holding unit that accumulates the charges converted by the converting unit in the conversion period and holds the charges transferred from the converting unit after the conversion period ends, and a reading unit that reads the charges held in the charge holding unit in a read period, and
when the multiple pixels of the pixel unit are divided equally into two groups of first and second groups and one of the first group and the second group of the pixel unit is set to the read period, the driving unit sets the other to the conversion period.

[2] The imaging element according to [1], wherein the driving unit sets the pixels belonging to each of the first group and the second group to the conversion period at the same time for every group.

[3] The imaging element according to [1] or [2], further including:
a generating unit that generates an image signal on the basis of the read charges.

[4] The imaging element according to [3], wherein the generating unit generates an image signal of an odd-numbered frame on the basis of the charges read from the first group and generates an image signal of an even-numbered frame on the basis of the charges read from the second group.

[5] The imaging element according to any one of [1] to [4], wherein the converting unit converts incidence light corresponding to the physical amount into charges.

[6] A driving method of an imaging element including a pixel unit that includes multiple pixels arranged in a matrix and a driving unit that drives the pixel unit, the pixel having a converting unit that converts a physical amount into charges in a conversion period, a charge holding unit that accumulates the charges converted by the converting unit in the conversion period and holds the charges transferred from the converting unit after the conversion period ends, and a reading unit that reads the charges held in the charge holding unit in a read period, the driving method including:
a step of, when the multiple pixels of the pixel unit are divided equally into two groups of first and second groups and one of the first group and the second group of the pixel unit is set to the read period, setting the other to the conversion period by the driving unit.

[7] An electronic apparatus having an imaging function,
wherein an imaging element including a pixel unit including multiple pixels arranged in a matrix and a driving unit to drive the pixel unit is mounted on the electronic apparatus,
the pixel has a converting unit that converts a physical amount into charges in a conversion period, a charge holding unit that accumulates the charges converted by the converting unit in the conversion period and holds the charges transferred from the converting unit after the conversion period ends, and a reading unit that reads the charges held in the charge holding unit in a read period, and
when the multiple pixels of the pixel unit are divided equally into two groups of first and second groups and one of the first group and the second group of the pixel unit is set to the read period, the driving unit sets the other to the conversion period.

[8] An imaging element including:
a photoelectric converting unit that performs photoelectric conversion on incident light;
a charge accumulating unit that accumulates charges obtained by the photoelectric conversion;
an initializing unit that is connected to the charge accumulating unit through at least one or more gates and initializes the charge accumulating unit; and
a voltage application control unit that applies a positive voltage to a well region where the photoelectric converting unit, the charge accumulating unit, and the initializing unit are provided, when the charge accumulating unit is initialized.

[9] The imaging element according to [8], wherein the voltage application control unit applies the positive voltage to the well region at the time of initializing the charge accumulating unit to read a reset level and at the time of reading a signal level.

[10] The imaging element according to [8] or [9], wherein the charge accumulating unit is a capacitor.

[11] The imaging element according to [10], wherein the capacitor has any of a MIM structure, a PIM structure, and a PIP structure.

[12] The imaging element according to [8] to [11], wherein the photoelectric converting unit, the charge accumulating unit, and the initializing unit are provided for each of a plurality of pixels configuring a pixel array unit to image an image and the voltage application control unit applies the positive voltage to all pixels on the pixel array unit at the same time.

[13] The imaging element according to [12], wherein the well regions of all pixels on the pixel array unit are formed to be electrically integrated.

[14] The imaging element according to [8] to [11], wherein the photoelectric converting unit, the charge accumulating unit, and the initializing unit are provided for every plurality of pixels configuring a pixel array unit to image an image and the voltage application control unit applies the positive voltage for every pixel row including pixels arranged in a horizontal direction on the pixel array unit.

[15] The imaging element according to [14], wherein the well regions of the pixels of the pixel row on the pixel array unit are formed to be electrically integrated and the well region of each pixel row is electrically isolated.

[16] The imaging element according to [8] to [11], wherein the photoelectric converting unit, the charge accumulating unit, and the initializing unit are provided for each of a plurality of pixels configuring a pixel array unit to image an image and the voltage application control unit applies the positive voltage for every pixel block including some pixels on the pixel array unit.

[17] The imaging element according to [16], wherein the well regions of the pixels of the pixel block on the pixel array unit are formed to be electrically integrated and the well region of each pixel block is electrically isolated.

[18] The imaging element according to [8] to [11], wherein the photoelectric converting unit, the charge accumulating unit, and the initializing unit are provided for each of a plurality of pixels configuring a pixel array unit to image an image and the well region of each pixel on the pixel array unit is electrically isolated.

[19] The imaging element according to [8] to [18], further including:
a charge/voltage converting unit that is provided between the initializing unit and the charge accumulating unit and converts charges into a voltage signal,
wherein the charges accumulated in the charge accumulating unit are transferred to the charge/voltage converting unit through one or more gates.

REFERENCE SIGNS LIST

11 Solid-state imaging element
21 Pixel array unit
61 Photodiode
63 First transfer gate unit
64 First charge accumulating unit
65 Second transfer gate unit
66 Second charge accumulating unit
67 Third transfer gate unit
68 Charge/voltage converting unit
69 Reset gate unit
72 Connection line
201 Gain control gate unit
202 Charge accumulating unit

The invention claimed is:
1. An imaging element, comprising:
a pixel unit that includes multiple pixels arranged in a matrix; and
a driving unit configured to drive the pixel unit,
wherein each of the multiple pixels has a converting unit configured to convert a physical amount into charges in a conversion period, a charge holding unit configured to accumulate the charges converted by the converting unit in the conversion period and hold the charges transferred from the converting unit after the conversion period ends, and a reading unit configured to read the charges held in the charge holding unit in a read period,
in an event the multiple pixels of the pixel unit are divided equally into two groups of first and second groups and one of the first group or the second group of the pixel unit is set to the read period, the driving unit is configured to set other of the first group or the second group to the conversion period,
wherein pixels that belong to the first group and the second group are set to be arranged alternatively in a horizontal direction and a vertical direction, and
a first conversion period of the first group and a second conversion period of the second group are non-overlapping.

2. The imaging element according to claim 1, wherein the driving unit is further configured to set the pixels that belong to each of the first group and the second group to the conversion period at a same time for every group.

3. The imaging element according to claim 2, further comprising:
a generating unit configured to generate an image signal based on the read charges.

4. The imaging element according to claim 3, wherein the generating unit is further configured to generate a first image signal of an odd-numbered frame based on the charges read from the first group and generate a second image signal of an even-numbered frame based on the charges read from the second group.

5. The imaging element according to claim 2, wherein the converting unit is further configured to convert incidence light that corresponds to the physical amount into the charges.

6. A driving method, comprising:
in an imaging element including a pixel unit that includes multiple pixels arranged in a matrix and a driving unit configured to drive the pixel unit, each of the multiple pixels having a converting unit configured to convert a physical amount into charges in a conversion period, a charge holding unit configured to accumulate the charges converted by the converting unit in the conversion period and hold the charges transferred from the converting unit after the conversion period ends, and a reading unit configured to read the charges held in the charge holding unit in a read period:
setting, in an event the multiple pixels of the pixel unit are divided equally into two groups of first and second groups and one of the first group or the second group of the pixel unit is set to the read period, other of the first group or the second group to the conversion period by the driving unit,
wherein pixels that belong to the first group and the second group are set to be arranged alternatively in a horizontal direction and a vertical direction, and
a first conversion period of the first group and a second conversion period of the second group are non-overlapping.

7. An electronic apparatus that has an imaging function, comprising:
an imaging element that includes a pixel unit that includes multiple pixels arranged in a matrix; and
a driving unit configured to drive the pixel unit,
wherein each of the multiple pixels has a converting unit configured to convert a physical amount into charges in a conversion period, a charge holding unit configured to accumulate the charges converted by the converting unit in the conversion period and hold the charges transferred from the converting unit after the conversion period ends, and a reading unit configured to read the charges held in the charge holding unit in a read period,
in an event the multiple pixels of the pixel unit are divided equally into two groups of first and second groups and one of the first group or the second group of the pixel unit is set to the read period, the driving unit is configured to set other of the first group or the second group to the conversion period, wherein pixels that belong to the first group and the second group are set to be arranged alternatively in a horizontal direction and a vertical direction, and a first conversion period of the first group and a second conversion period of the second group are non-overlapping.

* * * * *